(12) United States Patent
Kanamura

(10) Patent No.: US 7,304,386 B2
(45) Date of Patent: Dec. 4, 2007

(54) SEMICONDUCTOR DEVICE HAVING A MULTILAYER WIRING STRUCTURE

(75) Inventor: Ryuichi Kanamura, Tokyo (JP)

(73) Assignee: Sony Corporation, Tokyo (JP)

( * ) Notice: Subject to any disclaimer, the term of this patent is extended or adjusted under 35 U.S.C. 154(b) by 14 days.

(21) Appl. No.: 11/268,905

(22) Filed: Nov. 8, 2005

(65) Prior Publication Data

US 2006/0055046 A1 Mar. 16, 2006

Related U.S. Application Data

(63) Continuation of application No. 10/823,035, filed on Apr. 13, 2004, now Pat. No. 7,242,096.

(30) Foreign Application Priority Data

Apr. 14, 2003 (JP) ............................ P2003-108729

(51) Int. Cl.
*H01L 23/48* (2006.01)
*H01L 23/58* (2006.01)
(52) U.S. Cl. ...................... 257/759; 257/640; 257/642; 257/751; 257/760; 257/762
(58) Field of Classification Search ................ 257/637, 257/639, 640, 642, 643, 751, 758–760, 762, 257/773
See application file for complete search history.

(56) References Cited

U.S. PATENT DOCUMENTS 6,534,870 B1* 3/2003 Shimooka et al. .......... 257/759
6,949,830 B2* 9/2005 Owada et al. .............. 257/760

* cited by examiner

*Primary Examiner*—Hung Vu
(74) *Attorney, Agent, or Firm*—Sonnenschien Nath & Rosenthal LLP

(57) ABSTRACT

The present invention provides a semiconductor device having a multilayer wiring structure including a lower Cu buried-wiring layer, a SiC film, a SiOC film of 400 nm in thickness functioning as an interlayer insulating film, and an upper Cu buried-wiring layer electrically connected to the lower buried-wiring layer through contact plugs passing through the interlayer insulating film. The contact plugs and the upper Cu buried wiring layer are formed a single burying step of the dual damascene process. The SiOC film has a carbon content of about 12 atomic % and a relative dielectric constant of about 3.0. The upper Cu buried wiring layer is formed by burying a Cu film, through a barrier metal, in wiring grooves which are provided in the inter-wiring insulating film including a laminated film of an organic film, e.g., a PAE film of 200 nm in thickness, and a SiOC film of 150 nm in thickness.

3 Claims, 23 Drawing Sheets

US 7,304,386 B2

SEMICONDUCTOR DEVICE HAVING A MULTILAYER WIRING STRUCTURE

RELATED APPLICATION DATA

The present application is a continuation of U.S. application Ser. No. 10/823,035 filed Apr. 13, 2004, now U.S. Pat. No. 7,242,096 which claims benefit of and priority to Japanese Application No. JP 2003-108729 filed Apr. 14, 2003. The contents of all these applications are incorporated herein by reference to the extent permitted by law.

BACKGROUND OF THE INVENTION

1. Field of the Invention

The present invention relates to a method for manufacturing a semiconductor device comprising a low-dielectric-constant interlayer insulating film having a dual damascene multi-layer wiring structure, and particularly a method for manufacturing a semiconductor device having a dual damascene wiring structure excellent in shape.

2. Description of the Related Art

An electric signal delay due to the time constant of wiring has became a serious problem with the miniaturization and higher integration of semiconductor devices. Therefore, instead of aluminum (Al) alloy wiring, copper (Cu) wiring having low electric resistance has been introduced into an electrically conductive layer used in a multi-layer wiring structure.

Unlike metal materials such as Al and the like used for conventional multi-layer wiring structures, Cu has a difficulty in patterning by dry etching, and thus a damascene method is generally applied to a Cu multilayer wiring structure, in which a Cu film is buried in a wring groove formed in an insulating film to form a wiring pattern.

Particularly, the dual damascene method disclosed in Japanese Unexamined Patent Application Publication No. 10-143914 comprises forming connecting holes and wiring grooves and then simultaneously burying Cu in the holes and grooves, and this method attracts attention because it is effective in decreasing the number of the steps.

In a high-integrated semiconductor device, an increase in inter-wiring capacity decreases the operation speed of the semiconductor device, and thus micro multi-layer wiring using a low-dielectric constant film as an interlayer insulating film is indispensable for suppressing an increase in inter-wiring capacity.

In addition to fluorine-containing silicon oxide (FSG) having a relative dielectric constant of about 3.5 and conventionally proven by actual use, low dielectric constant films having a relative dielectric constant of about 2.7 and made of organic silicone polymers such as polyaryl ether (PAE), inorganic materials such as hydrogen silsequioxane (HSQ), methyl silsesquioxane (MSQ), and the like can be used as materials for a low dielectric constant interlayer insulating film. Furthermore, attempts have recently been made to make these materials porous and use as low dielectric constant materials having a relative dielectric constant of about 2.2.

When the dual damascene method is applied to the low dielectric constant interlayer insulating film, the technical restrictions described below must be resolved.

First, the low dielectric constant film has a composition close to the composition of a resist used for patterning, and thus the low dielectric constant film is also easily damaged in a resist removing process. Specifically, inhibition of damage to the low dielectric constant film is indispensable in peeling the resist after etching using a resist mask and in regenerating the resist when the treated resist pattern does not satisfy product specifications.

Second, attention must be paid to the application of the dual damascene method to a borderless structure with no margin between wiring and connecting holes.

Multi-layer wiring after the 0.18 μm generation of micro semiconductor devices is based on the major premise that a process adaptable to a borderless structure is used. Therefore, it is important to use a process causing little variation in via resistance due to misalignment even when a wiring groove and a connecting hole are simultaneously formed in an interlayer insulating film including a low dielectric constant film by the dual damascene method.

Third, in order to form the wiring grooves with high controllability of depth, an anti-etching film is preferably disposed near the bottoms of the wiring grooves. However, when the anti-etching film having a relatively high relative dielectric constant is disposed in an interlayer insulating film, the interlayer capacity is undesirably increased.

Therefore, a dual damascene process capable of controlling the formation of the wiring grooves while suppressing an increase in capacity is required for a low dielectric constant interlayer film structure.

An example of a dual damascene process capable of resolving the above-described technical restrictions is the technique disclosed in Japanese Unexamined Patent Application Publication No. 2000-150519 or 2001-44189.

An example of application of the dual damascene process to a low dielectric constant interlayer film disclosed in Japanese Unexamined Patent Application Publication No. 2001-44189 will be described below with reference to FIGS. 11 to 13. FIGS. 11A and 11B, FIGS. 12C to 12E, and FIGS. 13F and 13G are sectional views showing respective steps for forming a dual damascene structure by the method disclosed in Japanese Unexamined Patent Application Publication No. 2001-44189.

First, as shown in FIG. 11A, a laminated film including an organic insulating film 52 and a silicon oxide ($SiO_2$) film 53 is deposited as an inter-wring insulating film on an underlying insulating film 51 deposited on a substrate not shown in the drawing, and then copper (Cu) film buried wiring 54 is formed in the inter-wiring insulating film.

Then, a silicon carbide (SiC) film 55 functioning as an antioxidative layer for the Cu film, a carbon-containing silicon oxide (SiOC) film 56 such as a methyl silsesquioxane (MSQ) film, and a polyaryl ether (PAE) film 57 as an organic insulating film are successively deposited on the Cu buried wiring 54.

Then, a silicon oxide ($SiO_2$) film 58 functioning as a first mask forming layer and a silicon nitride (SiN) film 59 functioning as a second mask forming layer are successively deposited. Furthermore, a resist mask 60 having a wiring groove pattern is formed on the SiN film 59.

Next, as shown in FIG. 11B, the SiN film 59 is etched by a dry etching method using the resist mask 60 to form a second mask 59' (SiN film 59) having the wiring groove pattern, and then the resist mask 60 is removed.

Then, a resist mask 61 having a connecting hole pattern is formed on the second mask 59' and the $SiO_2$ film 58 so that at least a portion of the resist pattern for the connecting hole pattern overlaps with the second mask 59' (SiN film 59) having the wiring groove pattern.

As shown in FIG. 12C, the second mask 59' comprising the SiN film and the $SiO_2$ film 58 functioning as the first mask forming layer are etched by a dry etching method using the resist mask 61 having the connecting hole pattern to form apertures, and then the PAE film 57 is etched to form connecting holes 62 in which the SiOC film 56 is exposed. The resist mask 61 can be removed at the same time as etching of the PAE film 57.

Although the resist mask 61 is gradually thinned during the formation of the holes in the PAW film 57, the connecting holes 62 having a good open shape can be formed through a first mask 58' because of the presence of the first mask 58' comprising the SiO$_2$ film 58.

Next, as shown in FIG. 12D, the SiOC film 56 is further etched to dig down the connecting holes 62 to the SiC film 55 and form connecting holes 63. At the same time as the formation of the connecting holes 63, the SiO$_2$ film 58 constituting the first mask 58' and remaining in the wiring groove formation region is etched through the second mask 59' (SiN film 59) having the wiring groove pattern to form a wiring groove pattern 64.

As shown in FIG. 12E, the PAE film 57 remaining at the bottom of the wiring groove pattern 64 is etched to form wiring grooves 66, and the SiC film 55 remaining at the bottoms of the connecting holes 63 is etched to communicate the connecting holes 63 with the Cu buried wiring 54, thereby completing the predetermined dual damascene process for forming the connecting holes 65 and the wiring grooves 66.

The second mask 59' (SiN film 59) remaining out of the wiring groove region is removed in the process for etching the SiC film 55 remaining at the bottoms of the connecting holes 63.

Then, the extraneous matters remaining after etching on the side walls of the connecting holes 65 and the wiring grooves 66 are removed by a post-treatment with a chemical and RF sputtering to normalize Cu affected layers at the bottoms of the connecting holes 65. Then, as shown in FIG. 13F, a Ta film 67 is deposited as a barrier metal by sputtering, and a Cu film 68 is deposited by an electrolytic plating or sputtering method to bury an electrically conductive film in the connecting holes 65 and the wiring grooves 66.

Next, as shown in FIG. 13G, portions of the deposited Ta film 67 and Cu film 68, which are unnecessary for the wiring pattern, are removed by a chemical mechanical polishing (CMP) method. A dual damascene multi-layer wiring structure can be formed through the above-described steps.

Furthermore, for example, a SiC film 69 is deposited as an antioxidative layer on the dual damascene wiring 68 in the same manner as the lower Cu buried wiring 54.

The application of the above-described conventional dual damascene process to multi-layer wiring after the 0.1 μm generation of micro devices has the following problem.

Since the second mask 59' is used for forming the connecting holes 63 by etching the SiOC film (MSQ film) 56 used as a connecting hole interlayer film, and for forming the wiring pattern 64 in the wiring groove formation region of the SiO$_2$ film 58, the second mask 59' requires a certain thickness. For example, when the SiOC film 56 functioning as the connecting hole interlayer film and having a thickness of 400 nm is etched by using the SiN film 59 as the second mask 59', from the viewpoint of etching electivity, the SiN film 59 having a thickness of 100 nm to 150 nm is required for suppressing widening of the upper portions or scraping of the shoulders of the wiring grooves.

However, when the second mask forming layer, i.e., the SiN film 59, becomes thick, the second mask 59' is inevitably formed on steps by etching the SiN film 59, thereby causing difficulties in accurately forming a micro pattern of the second mask 59' on the steps.

The inventor proposes a dual damascene process using three-layer masks in Japanese Unexamined Patent Application Publication No. 2002-221069 in which a SiO$_2$ film of 150 nm in thickness used as a first mask forming layer, a silicon nitride (SiN) film of 100 nm in thickness used as a second mask forming layer, and a SiO$_2$ film of 50 nm in thickness used as a third mask forming layer are deposited on the PAE film 57.

The dual damascene process using the three-layer mask structure proposed in Japanese Unexamined Patent Application Publication No. 2002-221069 (referred to as "prior application" hereinafter) will be described below with reference to FIGS. 14 and 15. FIGS. 14A to 14C and FIGS. 15D to 15F are sectional views showing respective steps for forming a dual damascene structure by the method disclosed in the prior application. In FIGS. 14 and 15, the same portions as those shown in FIGS. 11 to 13 are denoted by the same reference numerals.

First, as shown in FIG. 14A, a laminated film including an organic insulating film 52 and a silicon oxide (SiO$_2$) film 53 is deposited as an inter-wiring insulating film on an underlying insulating film 51 by the same method as in the above-described publication, and then copper (Cu) film buried wiring 54 is formed in the inter-wiring insulating film. Then, a silicon carbide (SiC) film 55, a carbon-containing silicon oxide (SiOC) film 56, and a PAE film 57 are successively deposited on the Cu buried wiring 54.

Then, a SiO$_2$ film 58 of 150 nm in thickness used as a first mask forming layer, a silicon nitride (SiN) film 59 of 100 nm in thickness used as a second mask forming layer, and a SiO$_2$ film 70 of 50 nm in thickness used as a third mask forming layer are successively deposited on the PAE film 57.

Next, a resist mask 60 having a wiring groove pattern as a resist pattern is formed on the SiO$_2$ film 70.

Next, as shown in FIG. 14B, the SiO$_2$ film 70 used as the third mask forming layer is etched through the resist mask 60 by a dry etching method to form a third mask 70' having a wiring groove intermediate pattern.

Then, as shown in FIG. 14B, a resist mask 61 having a connecting hole pattern is formed on the remaining SiO$_2$ film 70 and SiN film 59 so that at least a portion of the connecting hole pattern overlaps with the third mask 70' (SiO$_2$ film 70) having the wiring groove intermediate pattern.

Next, the SiO$_2$ film 70 remaining in the connecting hole formation region, the SiN film 59 functioning as the second mask forming layer, and the SiO$_2$ film 58 functioning as the first mask forming layer are etched by a dry etching method using the resist mask 61 having the connecting hole pattern. Then, as shown in FIG. 14C, the PAE film 57 is etched by using the remaining SiN film 59 as a second mask 59' to form connecting holes 62 for exposing the SiOC film 56. The remaining SiO$_2$ film 70 constitutes the third mask 70' having a wiring groove pattern.

The resist mask 61 can be removed at the same time as etching of the PAE film 57.

Next, as shown in FIG. 15D, the SiN film 59 is etched by a dry etching method using the third mask 70' (SiO$_2$ film 70) having the wiring groove pattern to form the second mask 59' having a wiring groove pattern 64. At the same time, the SiOC film 56 is etched to an intermediate portion to form connecting holes 71.

Next, as shown in FIG. 15E, the lower portion of the SiOC film 56 is etched by using the first mask 58' comprising the SiO$_2$ film 58 as a mask to form connecting holes 63 for exposing the SiC film 55.

At the same time, the SiO₂ film 58 remaining in the wiring groove region is removed by using the second mask 59' comprising the SiN film 59 having the wiring groove pattern to form the first mask 58' having the wiring groove pattern.

Next, as shown in FIG. 15F, the PAE film 57 remaining at the bottoms of the wiring grooves is etched by using the first mask 58' (SiO₂ film 58) to form wiring grooves 66, and the SiC film 55 remaining at the bottoms of the connecting holes is etched to form connecting holes 65 communicating with the Cu buried layer 54, thereby completing the predetermined dual damascene process.

Then, the same process as the above-described conventional method is performed to form upper buried wiring 68.

In the dual damascene structure multilayer wiring formed as described above, when the resist mask 61 having the connecting hole pattern is formed, the step difference of the under layer can be suppressed to about 50 nm equal to the thickness of the remaining SiO₂ film 70, and thus the resist mask having the high-precision connecting hole pattern can be formed. By using the resist pattern having the high-precision connecting hole pattern, the connecting holes having micro dimensions can be stably formed without deteriorating the shape of the wiring grooves.

Therefore, excellent via contact characteristics can be obtained. By applying the method of this embodiment, a semiconductor device comprising a low dielectric constant interlayer insulating film having a dual damascene structure with a good wiring shape can be manufactured in high yield.

In order to decrease the inter-wiring capacity, the inventor further attempted to use a carbon-containing silicon oxide film (SiOC: relative dielectric constant 3.0) instead of the SiO₂ film 53 (relative dielectric constant 4.1) deposited on the organic insulating film 52 and constituting the inter-wiring insulating film of the lower wiring, and the SiO₂ film 58 (relative dielectric constant 4.1) constituting the inter-wiring insulating film of the upper wiring and functioning as the first mask forming layer.

The configuration and problem of a modification attempted by the inventor will be described below with reference to FIGS. 16 to 20. FIGS. 16A and 16B, FIGS. 17C and 17D, FIGS. 18E and 18F, FIGS. 19G and 19H, and FIGS. 20I and 20J are sectional views showing the respective steps of the modification. In FIGS. 16 to 20, the same portions as those shown in FIGS. 1 to 10 are denoted by the same reference numerals.

As shown in FIG. 16A, a laminated insulating film including an organic insulating film, for example, a PAE film 2, and a carbon-containing silicon oxide (SiOC) film 3 having a relative dielectric constant of about 3.0 is first deposited on an underlying insulating film 1 deposited on a substrate not shown in the drawing. Then, wiring grooves are formed in the laminated insulating film, and copper (Cu) film buried wiring 4 is formed in the wiring grooves. The SiOC film 3 is deposited by a parallel plate plasma CVD apparatus using methylsilane as a silicon source of raw material gases.

Then, a silicon carbide (SiC) film 5 functioning as an antioxidative layer for the Cu film, a carbon-containing silicon oxide (SiOC) film 6 and a polyaryl ether (PAE) film 7 as an organic insulating film are successively deposited on the Cu-buried wiring 4.

Then, a SiOC film 8 having a relative dielectric constant of about 3.0 and functioning as a first mask forming layer, a silicon nitride (SiN) film 9 functioning as a second mask forming layer, and a SiO₂ film 10 functioning as a third mask forming layer and having a thickness of 50 nm are successively deposited on the PAE film 7.

Then, a resist mask 11 having a wiring groove pattern as a resist pattern is formed on the SiO₂ film 10.

Next, as shown in FIG. 16B, the SiO₂ film 10 functioning as the third mask forming layer is etched by dry etching through the resist mask 11 to form a third mask 10' having a wiring groove pattern 13 on the SiN film 9.

After etching of the SiO₂ film 10, the resist mask 11 and the extraneous matters remaining after etching are completely removed by an appropriate post-treatment.

Then, as shown in FIG. 17C, a resist mask 12 having a connecting hole pattern is formed on the remaining SiO₂ film 10 and SiN film 9 so that at least a portion of the connecting hole pattern overlaps with the third mask 10' (SiO₂ film 10) having the wiring groove pattern 13.

Then, the third mask 10' (SiO₂ film 10), the SiN film 9 functioning as the second mask forming layer, and the SiOC film 8 functioning as the first mask forming layer are etched by dry etching through the resist mask 12, and the PAE film 7 is further etched by using the remaining SiN film 9 as a second mask to form connecting holes 14 for exposing the SiOC film 6, as shown in FIG. 17D. The remaining SiO₂ film 10 forms the mask 10' having the wiring groove pattern 13.

The resist mask 12 can be removed at the same time as etching of the PAE film 7.

Next, as shown in FIG. 18E, the SiN film 9 is etched by a dry etching method using the third mask 10' (SiO₂ film 10) having the wiring groove pattern 13 to form the second mask 9' having a wiring groove pattern 15.

In the step of etching the SiN film 9 functioning as the second mask forming layer through the third mask 10', the SiOC film 6 exposed at the bottoms of the connecting holes 14 is etched to an intermediate position to dig down the connecting holes 14 and form connecting holes 16.

Under these etching conditions, the etching selectivity (SiN/SiOC) to the SiOC film can be set to be slightly smaller than 1, and thus when the SiN film 9 of 100 nm in thickness is etched, the connecting holes 16 can be dug down in the SiOC film 6 to a depth of 150 to 200 nm including a necessary amount of over etching.

Next, the remaining lower layer of the SiOC film 6 is etched by using a first mask 8' (SiO₂ film 8) as a mask to form connecting holes 17 for exposing the SiC film 5, as shown in FIG. 18F. At the same time, the first mask 8' (SiOC film 8) remaining in the wiring groove region is removed by using the second mask 9' (SiN film 9) having the wiring grove pattern 15 to form the apertures 18 of wiring grooves.

However, as shown in FIG. 19G, it was confirmed that a region 19 including the remaining SiOC film 8 occurs in the aperture 18A of a wide wiring groove during the formation of the connecting holes 17 and the wiring grooves 18.

This is a phenomenon characteristic of etching of the SiOC film 8 based on the processing selectivity of the SiOC film to be processed to the SiN film 9 used as the etching mask. Namely, while the SiOC film 6 in which the connecting holes 17 are formed, and the SiOC film 8 remaining in apertures narrower than a certain wiring groove can be easily removed to form apertures, carbon is excessively supplied from the SiOC film 8 into the etching atmosphere in such an aperture of a wide wiring groove as the aperture 18A to possibly stop etching of the SiOC film.

It was also found that when the etching conditions are changed for preventing the phenomenon and easily forming the apertures in the SiOC film, the selectivity to the SiN film used as the etching mask is decreased to increase a conversion difference. The "conversion difference" means a difference between the open dimension of the first mask 8' (SiOC film 8) and the open dimension of the second mask 9' (SiN film 9).

Then, the PAE film 7 remaining at the bottoms of the wiring grooves 18 is etched to form wiring grooves 20, and the SiC film 5 exposed at the bottoms of the connecting holes 17 is etched to complete the predetermined dual damascene process.

The second mask 9' (SiN film 9) remaining outside the wiring groove region is removed at the same time as etching of the SiC film 5 exposed at the bottoms of the connecting holes 17.

However, etching of the PAE film 7 and the SiC film 5 has the problem of causing three problems with the shape.

The first problem is that the aperture pattern for a wide wiring groove has the region 19 in which the SiOC film 8 remains, and thus the wiring groove 20 having a predetermined shape cannot be formed by etching a region 21 of the PAE 7, as shown in FIG. 19H.

The second problem is that misalignment between the connecting holes 17 and the lower wiring 4 causes slit-shaped trenches 22 in the inter-wiring insulating film of the lower wiring 4 immediately below the connecting holes 17.

The third problem is that in the first mask 8' (SiOC film 8) remaining below the second mask 9' (SiN film 9), the aperture shoulders of the wiring grooves 20 are significantly scraped off.

The second and third problems are due to the fact that in etching the SiC film 5 and the SiN film 9, only a selectivity (SiC/SiOC or SiN/SiOC) of about 1 to the SiOC film 8 can be secured.

Then, the extraneous materials remaining after etching on the wide walls of the wiring grooves 20 and the connecting holes 17, and Cu altered layers at the bottoms of the connecting holes 17 are cleaned off by a post-treatment with a chemical and hydrogen annealing. Then, as shown in FIG. 20I, for example, a Ta film 23 is deposited as a barrier metal by sputtering, and a Cu film 24 is deposited by electrolytic plating or sputtering to bury a conductive film in the connecting holes 17 and the wiring grooves 20.

However, in a region where misalignment occurs between a connecting hole 17 and the lower wiring 14, the slit-shaped trench 22 is produced to locally increase the aspect ratio, thereby causing the problem of producing a burying defect 25.

Then, as shown in FIG. 20J, in the deposited Ta film 23 and Cu film 24, unnecessary portions for the wiring pattern are removed by a chemical mechanical polishing (CMP) method to form a dual damascene multi-layer wiring structure. Like in the lower wiring pattern, for example, a SiC film 27 is deposited as an antioxidative layer on the dual damascene wiring 23/24.

However, in an aperture 26 for wide wiring, the SiOC film 8 remains in the region 19, and the PAE film 7 remains in the region 21, thereby causing the problem of locally thinning the wiring layer in the aperture 26.

The multi-layer wiring formed by the above-described dual damascene process has the problem of locally increasing the resistance of the connecting holes and wiring due to the occurrence of the burying defect 25 of the Cu film in the connecting holes and the locally thinned region 26 of the wiring film.

Also, the condition of the SiOC film 8 remaining in the region 19 varies. In an extreme case, wide wiring is completely broken, leading to a conduction defect.

Furthermore, even when wiring is electrically connected to the connecting holes within the operation range of a semiconductor device, a current and thermal stress are concentrated in the thin local region of the Cu wiring, and the growth of the burying defect 25 occurring in a connecting hole 17 is highly likely to induce reliability defects such as electromigration and stress migration in the operating environment.

SUMMARY OF THE INVENTION

Accordingly, it is an object of the present invention to provide a semiconductor device comprising a multi-layer wiring structure with low inter-wiring capacity, in which a laminated insulating film of an organic insulating film and a SiOC film is used as an inter-wiring insulating film of upper wiring, and a low dielectric constant interlayer structure has a good shape formed by a dual damascene process, and a method for manufacturing the semiconductor device.

In order to solve the problems of the processed shape of the above-described modification, the inventor carried out the experiments described below.

EXPERIMENTAL EXAMPLE 1

A SiOC film was etched with a gas mixture ($C_5H_8$/CO/Ar/$O_2$) as an etching gas using a SiN film as a mask to experimentally determine the relationship between the carbon content (atomic %) of the SiOC film and the relative ratio (SiOC/$SiO_2$) of the amount of etching of the SiOC film to that of a $SiO_2$ film, and the results shown in FIG. 21 were obtained. FIG. 21 indicates that when the carbon content of the SiOC film exceeds 9 atomic %, the etching amount of the SiOC film rapidly decreases.

In Experimental Examples 1 and 2, the flow rate ratio of methylsilane to oxygen used for depositing the SiOC film by a parallel plate CVD apparatus was changed to control the carbon content of the SiOC film.

EXPERIMENTAL EXAMPLE 2

A SiOC film was etched with a gas mixture ($CH_2F_2$/$O_2$/Ar) as an etching gas using a SiN film as a mask to experimentally determine the relationship between the carbon content (atomic %) of the SiOC film and the etching electivity of a SiC film or SiN film to the SiOC film, and the results shown in FIG. 22 were obtained.

In Experimental Example 2, it was found that when the etching electivity of the SiC film or SiN film to the SiOC film decreases as the carbon content of the SiOC film increases.

As shown in FIG. 23, the relative dielectric constant of the SiOC film depends upon the carbon content in such a manner that the relative dielectric constant tends to increase as the carbon content decreases. However, comparison to FIGS. 21 and 22 indicates that the relative dielectric constant does not change so rapidly as at least the etching rate of the SiOC film in etching with a halogen gas changes.

In the relationship between the carbon content and the relative dielectric constant shown in FIG. 23, an absolute value can be changed with a certain margin by controlling the deposition conditions for changing the density of the SiOC film or the like.

Therefore, the relationships shown in FIGS. 21 to 23 indicate the following.

(1) When the carbon content of the SiOC film is set to 9 atomic % or less to increase the etching rate, the first problem of the modification that the SiOC film 8 remains in the wide wring groove 18A can be prevented.

(2) When the carbon content of the SiOC film is 9 atomic % or less, the etching selectivity of the SiC film/SiOC film or SiN film/SiOC film can be kept at 1.5 or more. As a result, the second and third problems of the modification, i.e., the occurrence of the slit-shaped trenches and scraping of the aperture shoulders of the wiring grooves 20, can be prevented.

(3) When the carbon content of the SiOC film is 3 atomic % to 9 atomic %, the relative dielectric constant can be kept in the range of 3.2 to 3.8.

In order to achieve the object, on the basis of the above findings, a semiconductor device of the present invention (referred to as a "first embodiment" hereinafter) has a wiring structure formed by a dual damascene method, the wiring structure comprising a lower buried-wiring layer, an interlayer insulating film provided on the lower buried-wiring layer, an inter-wiring insulating film provided on the interlayer insulating film, and an upper buried-wiring layer buried in wiring grooves provided in the inter-wiring insulating film, the upper buried-wiring layer being electrically connected to the lower buried-wiring layer through contact plugs passing through the interlayer insulating film. In the semiconductor device, the interlayer insulating film is a first carbon-containing silicon oxide film (SiOC film), and the inter-wiring insulating film comprises a laminated insulating film of an organic or inorganic low dielectric constant insulating film, and a second carbon-containing silicon oxide film (SiOC film) provided on the low dielectric constant insulating film, the second carbon-containing silicon oxide film having a lower carbon content than that of the first carbon-containing silicon oxide film.

The second carbon-containing silicon oxide film does not necessarily comprise one layer. Namely, in another semiconductor device of the present invention (referred to as a "second embodiment" hereinafter) having a wiring structure formed by a dual damascene method, the wiring structure comprising a lower buried-wiring layer, an interlayer insulating film on the lower buried-wiring layer, an inter-wiring insulating film provided on the interlayer insulating film, and a upper buried-wiring layer buried in wiring grooves provided in the inter-wiring insulating film, the upper buried-wiring layer being electrically connected to the lower buried-wiring layer through contact plugs passing through the interlayer insulating film, the interlayer insulating film is a first carbon-containing silicon oxide film (SiOC film), and the inter-wiring insulating film comprises a laminated insulating film of an organic or inorganic low dielectric constant insulating film, and a second carbon-containing silicon oxide film provided on the low dielectric constant insulating film, the second carbon-containing silicon oxide film comprising a plurality of layers having different carbon contents, and the carbon content of the top layer being lower than that of the first carbon-containing silicon oxide film.

In the first embodiment, the carbon content of the second carbon-containing silicon oxide film is preferably 3 atomic % to 9 atomic %.

In the second embodiment, the carbon content of the top layer of the second carbon-containing silicon oxide film is preferably 3 atomic % to 9 atomic %.

In the first and second embodiments, examples of the organic low dielectric constant insulating film include a polyaryl ether (PAE) film, a polyarylene ether film, an amorphous carbon film, a polytetrafluoroethylene film, and the like. Examples of the inorganic low dielectric constant insulating film include a xerogel film, a porous-structure methyl silsesquioxane (MSQ) film and hydrogen silsequi-oxane (HSQ) film, and the like. Furthermore, a combination of the organic and inorganic low dielectric constant insulating films may be used.

Although the interlayer insulating film preferably comprises a SiOC film, a SiOF film, a $SiO_2$ film, a MSQ film, or a HSQ film may be used.

In the first and second embodiments, instead of a conventional laminated insulating film of an organic insulating film and a $SiO_2$ film, the laminated film of the organic insulating film and the low dielectric constant SiOC film is provided as the inter-wiring insulating film of upper wiring, thereby decreasing the inter-wiring capacity of the upper wiring as compared with a conventional device. In the second embodiment, the laminated film of a plurality of SiOC films having different carbon contents is provided to further decrease the inter-wiring capacity of the upper wiring and realize a wiring structure having a good shape.

In the first and second embodiments, the lower buried wiring layer is more preferably buried in an inter-wiring insulating film provided below the interlayer insulating film and comprising an organic insulating film and a carbon-containing silicon oxide film provided thereon. Therefore, the inter-wiring capacity is further decreased.

In order to achieve the object, a method for manufacturing a semiconductor device of the present invention is a method for manufacturing a semiconductor device comprising a wiring structure including a lower buried-wiring layer, an interlayer insulating film provided on the lower buried-wiring layer, an inter-wiring insulating film provided on the interlayer insulating film, and a upper buried-wiring layer buried in wiring grooves provided in the inter-wiring insulating film, the upper buried-wiring layer being electrically connected to the lower buried-wiring layer through contact plugs passing through the interlayer insulating film. A method for forming the wiring structure comprises the steps of:

(1) depositing a first insulating film as the interlayer insulating film on the lower wiring;

(2) successively depositing a second insulating film and a first-mask forming layer functioning as a third insulating film and used for forming a first mask to form a laminated film functioning as the inter-wiring insulating film of the upper wiring, and depositing second and third mask forming layers for forming second mask and third mask, respectively;

(3) patterning the third mask forming layer to form the third mask having a wiring groove pattern;

(4) forming a resist mask having a connecting hole pattern on the second mask forming layer including the third mask;

(5) etching, through the resist mask, the third mask, the second mask forming layer, and the first mask forming layer functioning as the third insulating film, and further etching the second insulating film to form connecting holes;

(6) etching the second mask forming layer through the third mask to form the second mask having a wiring groove pattern, and digging down the connecting holes to an intermediate portion of the first insulating film;

(7) etching the first mask forming layer functioning as the third insulating film through the second mask to form the first mask having a wiring groove pattern, and further etching the first insulating film remaining at the bottoms of the connecting holes to form connecting holes;

(8) etching the second insulating film through the first mask to form wiring grooves in the second insulating film; and (9) removing the second and third masks.

A carbon-containing silicon oxide film (SiOC film) is deposited as the first mask forming layer functioning as the third insulating film.

Since the SiOC film is deposited as the first mask forming layer functioning as the third insulating film, the relative dielectric constant of the inter-wiring insulating film can be decreased to decrease the inter-wiring capacity.

Also, the carbon content of the SiOC film is controlled to the specified range described below, and thus the inter-wiring capacity can be further decreased.

In the method of the present invention, in step (4) of forming the resist mask having the connecting hole pattern, a step difference of an underlying layer can be suppressed to a low level depending upon the thickness of the third mask forming layer. Namely, the underlying layer is substantially flat, and thus the resist mask having the high-precision connecting hole pattern can be formed. Therefore, the connecting holes with micro dimensions can be stably formed without deterioration in the shape of the wiring grooves, and thus excellent via-contact characteristics can be achieved.

Since final patterning of the wiring grooves is performed after patterning of the connecting holes, mask alignment between the connecting holes and the upper wiring is direct alignment. Therefore, multilayer wiring with a small alignment error can be formed.

As described above, the dual damascene process using the method of the present invention can manufacture a semiconductor device having high-precision multilayer wiring with a low inter-wiring capacity in high yield.

In step (2) of the method of the present invention, an inorganic insulating film including a carbon-containing silicon oxide film having a carbon content of 3 atomic % to 9 atomic % is preferably deposited as the first mask forming layer functioning as the third insulating film.

In step (2), a carbon-containing silicon oxide film comprising a plurality of layers having different carbon contents may be deposited as the first mask forming layer functioning as the third insulating film, the carbon content of the top layer of the carbon-containing silicon oxide film being 3 atomic % to 9 atomic %.

In the method of the present invention, the carbon content of the SiOC film is controlled in the specified range to increase the etching rate, and thus the SiOC film can be prevented from remaining in a wide wiring groove.

Similarly, the carbon content of the SiOC film is controlled in the specified range to set the etching selectivity of SiC film/SiOC film or SiN film/SiOC film to 1.5 or more, and thus the occurrence of slit-shaped trenches in the inter-wiring insulating film of the lower wiring, and scraping of the aperture shoulders of the wiring grooves of the upper wiring, which occur in the conventional modification, can be prevented.

Therefore, the wiring structure having a predetermined shape can be formed by the dual damascene process.

In the method of the present invention, a carbon-containing silicon oxide film is deposited as the first insulating film in step (1), and an organic insulating film is deposited as the second insulating film in step (2).

In step (2), the first, second and third mask forming layers are deposited by using materials which permit etching of a lower mask forming layer by a reactive ion etching process through a mask formed in an upper mask forming layer.

For example, in step (2), a silicon nitride film (SiN film) and a silicon oxide film ($SiO_2$ film) are deposited as the second mask forming layer and the third mask forming layer, respectively.

The materials for depositing the second and third mask forming layers, respectively, are not limited as long as the second and third mask forming layers are deposited by using materials which permit etching of a lower mask forming layer by a reactive ion etching process through a mask formed in an upper mask forming layer. A SiC film may be used as the second mask forming layer instead of the SiN film, and an amorphous silicon film may be used as the third mask forming layer instead of the $SiO_2$ film.

In step (2), each of the first mask forming layer functioning as the third insulating film and the second and third mask forming layers is deposited by using a light-transmitting material.

In step (4) of forming the resist mask having the connecting hole pattern on the second mask forming layer including the third mask, the resist mask is formed so that at least a portion of the connecting hole pattern overlaps with a wiring groove intermediate pattern of the third mask. Therefore, misalignment between the upper wiring and the contact plugs can be prevented.

In the method of the present invention, in forming the lower wiring, an organic insulating film and a first carbon-containing silicon oxide film (SiOC film) may be deposited on the underlying layer, and the lower buried wiring layer may be formed in the organic insulating film and the first carbon-containing silicon oxide film.

In this case, the inter-wiring capacity of the lower wiring can be decreased.

DESCRIPTION OF THE PREFERRED EMBODIMENTS

Embodiments of the present invention will be described in further detail below with reference of the attached drawings. The film types, thicknesses, deposition methods and dimensions described below in the embodiments are only examples for facilitating understanding of the present invention, and the present invention is not limited to these examples.

Semiconductor Device of First Embodiment

Figure 1:
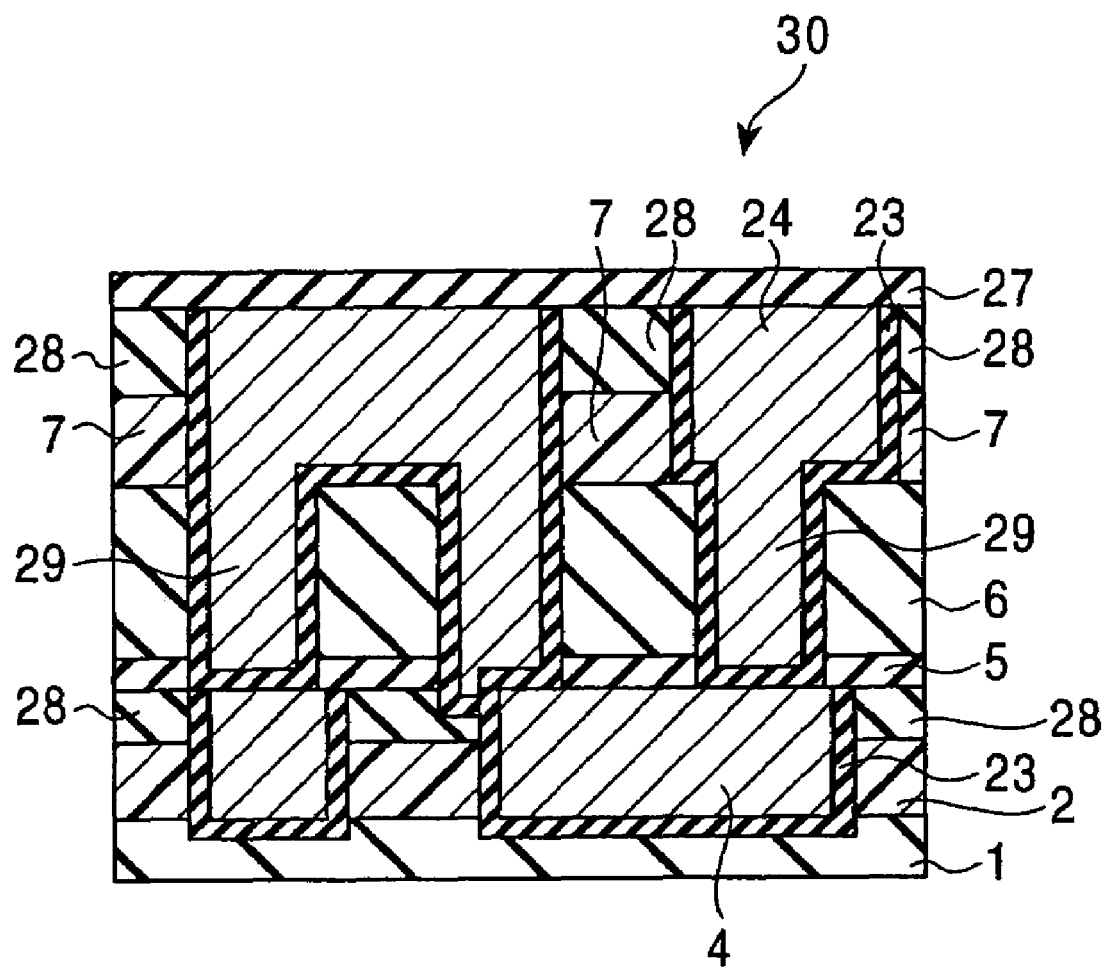
FIG. 1 is a sectional view showing the configuration of a semiconductor device according to a first embodiment of the present invention.

A semiconductor device according to a first embodiment of the present invention will be described. FIG. 1 is a sectional view showing the configuration of the semiconductor device of this embodiment.

As shown in FIG. 1, a semiconductor device 30 of this embodiment has a wiring structure comprising a lower Cu buried-wiring layer 4, a SiC film 5 deposited to a thickness of 50 nm as an antioxidative film for the lower Cu buried-wiring layer 4, a SiOC film 6 of 400 nm in thickness functioning as an interlayer insulating film, and an upper Cu buried-wiring layer 23/24 electrically connected to the lower Cu buried-wiring layer 4 through contact plugs 29 passing through the SiC film 5 and the SiOC film 6, the contact plugs 29 and the upper Cu buried-wiring layer 23/24 being formed in a single burying step of a dual damascene method.

The SiOC film 6 has a carbon content of about 12 atomic % and a relative dielectric constant of about 3.0.

The lower Cu buried-wiring layer 4 is formed by burying a Cu film, through a barrier metal 23, in wiring grooves provided in an inter-wiring insulating film formed on an underlying insulating film 1, the inter-wiring insulating film comprising a laminated film of an organic insulating film, for example, a PAE film 2 of 200 nm in thickness, and a SiOC film 28 of 50 nm in thickness, and the wiring thickness being 250 nm. The SiOC film 28 is first deposited to a thickness of 150 nm, the Cu buried layer is formed in the wiring grooves, and then Cu is polished by a CMP process under the condition that the finished thickness of the remaining SiOC film 28 is set to 50 nm.

The SiOC film 28 has a carbon content of about 6 atomic % and a relative dielectric constant of about 3.5. A PAE film 7 is an organic insulating film having a relative dielectric constant of about 2.6. The SiC film 5 functions as the antioxidative film for protecting the lower Cu buried-wiring layer 4 during the formation of the upper Cu buried-wiring layer by the dual damascene process.

The upper Cu buried-wiring layer 24 serves as buried wiring formed by burying a Cu film, through a barrier metal 23, in wiring grooves provided in an inter-wiring insulating film comprising a laminated film of an organic insulating film, for example, the PAE film 7 of 200 nm in thickness, and the SiOC film 28 of 150 nm in thickness.

In the semiconductor device 30 of this embodiment, each of the inter-wiring insulating films of the lower Cu buried-wiring layer 23/4 and the upper Cu buried-wiring layer 23/24 comprises the laminated film of the PAE film 2 or 7 and the SiOC film 28 having a relative dielectric constant of 3.5 instead of a conventional laminated film of the PAE film 2 or 7 and a SiO$_2$ film (relative dielectric constant 4.1). Therefore, the inter-wiring capacity of each of the lower wiring and upper wiring layers can be decreased by about 5 to 10% in comparison to a semiconductor device having a wiring structure formed by a conventional dual damascene process.

The types, thicknesses and deposition methods of the inter-wiring insulating films of the semiconductor device 30 of this embodiment are not limited. For example, the SiOC film 28 deposited on the PAE film 2 or 7 preferably has a carbon content of 3 atomic % to 9 atomic % from the viewpoint of processing characteristics and the effect of decreasing the inter-wiring capacity, and the carbon content is not limited to 6 atomic %.

Method for Manufacturing the Semiconductor Device of the First Embodiment

In this embodiment, a method for manufacturing a semiconductor device of the present invention is applied to the manufacture of the semiconductor device of the first embodiment of the present invention. FIGS. 2A and 2B, FIGS. 3C and 3D, FIGS. 4E and 4F, and FIGS. 5G and 5H are sectional views showing respective steps of the method for forming the wiring structure in the semiconductor device of this embodiment by the dual damascene process.

Figure 2A:
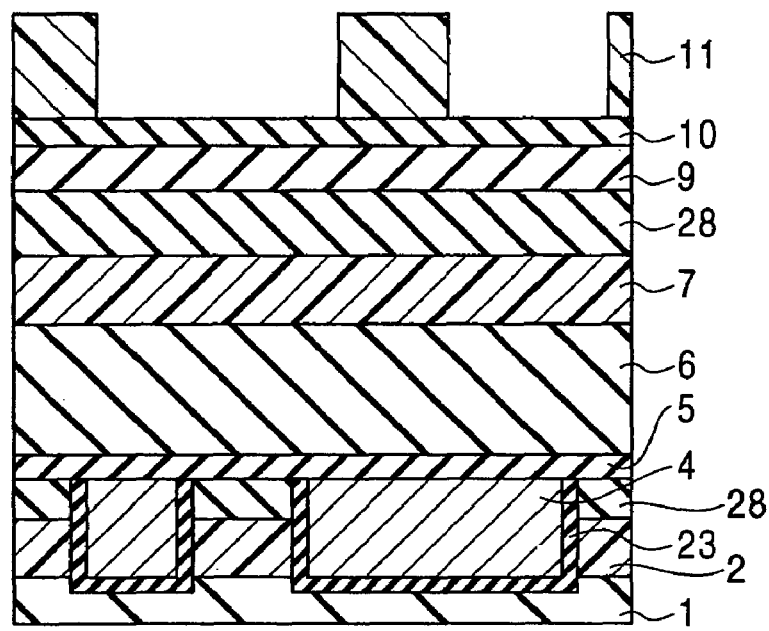
FIGS. 2A and 2B are sectional views showing respective steps of a method for forming a wiring structure by a dual damascene process according to the first embodiment.

First, as shown in FIG. 2A, an organic insulating film, for example, the PAE film 2 of 200 nm in thickness, and the carbon-containing silicon oxide film (SiOC film) 28 having a carbon content of 6 atomic % and a relative dielectric constant of about 3.5 are deposited to form a laminated film functioning as the inter-wiring insulating film on the underlying insulating film 1 which is deposited on a substrate not shown in the drawing. Then, the wiring grooves are formed in the inter-wiring insulating film, and a copper (Cu) film having a wiring thickness of 250 nm is buried in the wiring grooves through the barrier metal 23 to form the lower buried-wiring layer 4.

For example, the SiOC film 28 is deposited by a parallel plate plasma CVD apparatus as a deposition apparatus using trimethylsilane as a silicon source at a trimethylsilane/oxygen flow rate ratio of about 1:1. The deposition conditions include a substrate temperature of 350° C., a plasma power of 300 W, and a deposition ambient pressure of about 500 Pa.

Under these deposition conditions, the SiOC film 28 having a carbon content of 6 atomic % and a relative dielectric constant of about 3.5 can be deposited.

The SiOC film 28 is first deposited to a thickness of 150 nm, a Cu buried layer is formed in the wiring grooves, and then Cu is polished by a CMP process under the condition that the finished thickness of the remaining SiOC film 28 is set to 50 nm.

Then, the silicon carbide (SiC) film 5 of 50 nm in thickness is deposited as the antioxidative layer on the Cu wiring layer 4, and the carbon-containing silicon oxide film (SiOC) film 6 of 400 nm in thickness is deposited as a first insulating film (interlayer insulating film) in which the connecting through holes are formed.

Each of the SiC film 5 and the SiOC film 6 is deposited by a parallel plate plasma CVD apparatus using methylsilane as a silicon source gas.

The deposition conditions include a substrate temperature of 300° C. to 400° C., a plasma power of 150 W to 350 W, and a deposition ambient pressure of about 100 Pa to 1000 Pa.

Under these deposition conditions, the SiC film 5 having a relatively dielectric constant of about 5.0 and the SiOC film 6 having a carbon content of about 12 atomic % and a relative dielectric constant of 3.0 can be deposited.

Next, an organic polymer film having a relative dielectric constant of about 2.6 is deposited as a second insulating film on the SiOC film 6. In this embodiment, the polyaryl ether (PAE) film 7 is deposited to a thickness of 200 nm as the organic polymer film. The organic polymer film can be formed by depositing a precursor by spin coating, and then curing the coated precursor at 400° C. to 450° C.

Instead of the PAE film, a BCB film, a polyimide film, an amorphous carbon film, or the like may be used.

Then, the SiOC film 28 of 150 nm in thickness functioning as a first mask forming layer functioning as a third insulating film and functioning as a protective layer for the PAE film 7, and a silicon nitride film (SiN) film 9 of 100 nm in thickness functioning as a second mask forming layer, and a SiO$_2$ film 10 of 50 nm in thickness functioning as a third mask forming layer are successively deposited on the PAE film 7. As described below, a laminated film of the PAE film 7 and the SiOC film 28 functions as the inter-wiring insulating film of the upper wiring.

Then, a resist mask 11 having a wiring groove pattern as a resist pattern is formed on the SiO$_2$ film 10.

Like the SiOC film 28 deposited as the inter-wiring insulating film of the lower wiring on the PAE film 2, the SiOC film 28 functioning as the first mask forming layer functioning as the third insulating film has a relative dielectric constant of about 3.5 and a carbon content of 6 atomic %, and is deposited by the same method as that used for the SiOC film 28 as the inter-wiring insulating film of the lower wiring.

The SiO$_2$ film 10 functioning as the third mask forming layer can be deposited by a plasma CVD method using, for example, monosilane (SiH$_4$) as a silicon source and dinitrogen monoxide (N$_2$O) gas as an oxidizing agent.

The SiN film 9 functioning as the second mask forming layer can be deposited by the same plasma CVD method as that for the SiO$_2$ film 10 using, for example, monosilane (SiH$_4$) as a silicon source, ammonia (NH$_3$) gas as a nitriding agent, dinitrogen monoxide (N$_2$O) gas as an oxidizing agent, and an inert gas as a carrier gas.

Figure 2B:
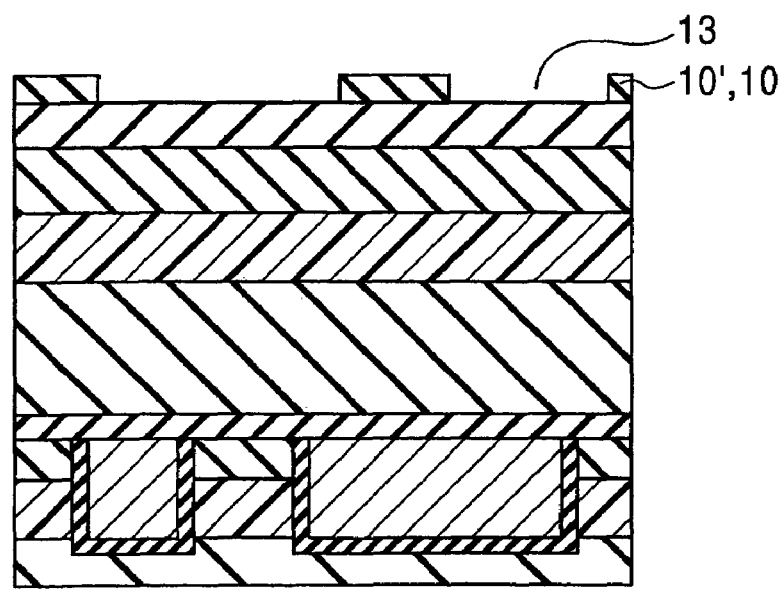

Next, as shown in FIG. 2B, the SiO$_2$ film 10 functioning as the third mask forming layer is etched by a dry etching method through the resist mask 11 to form a third mask 10' having a wiring groove intermediate pattern 13.

The SiO$_2$ film 10 is etched through the resist mask 11 by a general magnetron etching apparatus using, for example, octafluorobutane (C$_4$F$_8$), carbon monoxide (CO) and argon (Ar) as etching gases at a gas flow rate ratio (C$_4$F$_8$:CO:Ar) of 1:5:20 with a bias power of 1200 W and a substrate temperature of 20° C.

Under these etching conditions, an etching selectivity (SiO$_2$/SiN) of 10 or more to the SiN film can be obtained, and thus the SiN film 9 functioning as the lower second mask forming layer is little etched.

After etching of the SiO$_2$ film 10, the resist mask 11 and extraneous matters remaining after etching can be completely removed by, for example, ashing with oxygen (O$_2$) plasma used as a base and a treatment with an organic amine chemical.

Figure 3C:
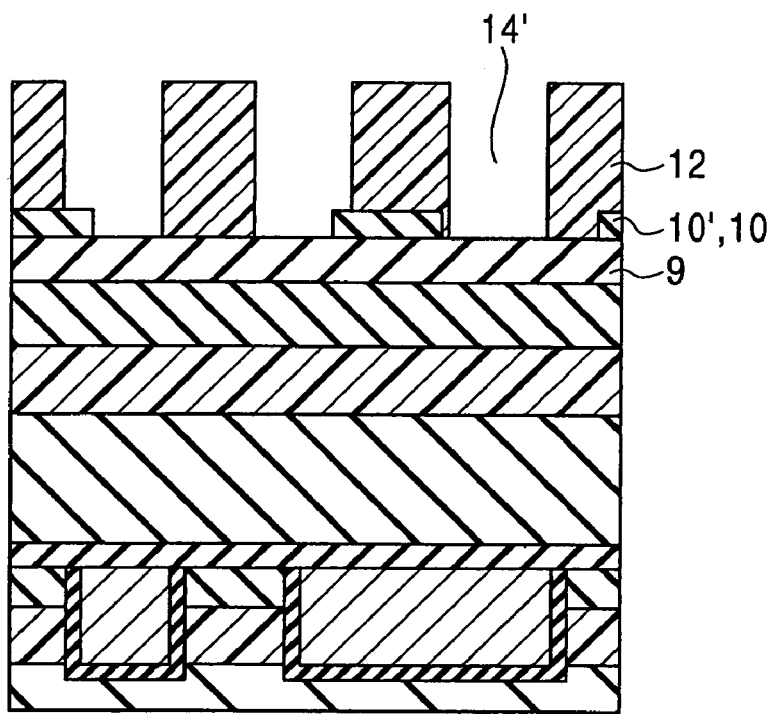
FIGS. 3C and 3D are sectional views showing respective steps after the step shown in FIG. 2B of the method for forming the wiring structure by the dual damascene process according to the first embodiment.

Next, as shown in FIG. 3C, a resist mask 12 having a connecting hole pattern 14' is formed on the remaining SiO$_2$ film 10 and the SiN film 9 so that at least a portion of the connecting hole pattern 14' overlaps with the third mask 10' (SiO$_2$ film 10) constituting the wiring groove intermediate pattern 13.

In forming the resist mask 12, the step difference formed by the SiO$_2$ film 10 constituting the wiring groove intermediate pattern 13 is suppressed to about 50 nm which is substantially equal to the thickness of the SiO$_2$ film 10, and thus a good resist pattern for the connecting holes can be formed with the lithography characteristics approximately equal to those for forming a resist mask on a flat portion.

Also, even when a coat-type anti-reflection film (BARC) is combined, variations in the buried shape of the BARC can be suppressed to a low level by controlling the dimensions and density of the wiring groove intermediate pattern 13, and thus deterioration in shape of the resist during exposure and a variation in the focal depth, which causes a dimensional variation, can be decreased.

Figure 3D:
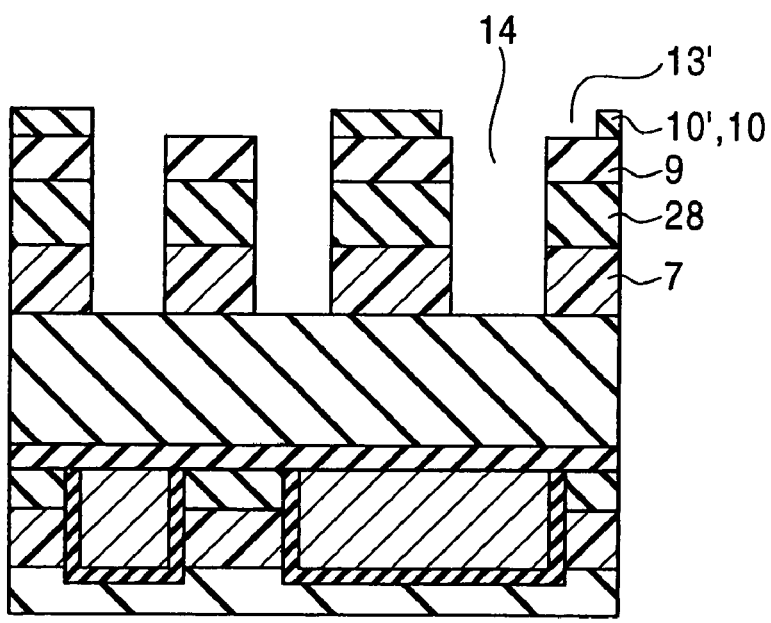

Then, the third mask 10' (SiO$_2$ film 10) remaining in the connecting hole region, the SiN film 9 functioning as the second mask forming layer, and the SiOC film 28 functioning as the first mask forming layer are etched by a dry etching method using the resist mask 12 having the connecting hole pattern 14'. Then, the PAE film 7 is etched by using the remaining SiN film 9 as a second mask 9' to form connecting holes 14 for exposing the SiOC film 6, as shown in FIG. 3D.

The remaining SiO$_2$ film 10 constitutes the mask 10' having a wiring groove pattern 13'.

The resist mask 12 can be removed at the same time as etching of the PAE film 7.

In etching the layers ranging from the SiO$_2$ film 10 to the SiOC film 28 to form the connecting holes 14, a general magnetron etching apparatus is used, and, for example, octafluorobutane (C$_4$F$_8$) and argon (Ar) are used as etching gases at a gas flow rate ratio (C$_4$F$_8$:Ar) of 1:4 with a bias power of 400 W and a substrate temperature of 20° C.

In this embodiment, under these etching conditions, the etching selectivity (SiO$_2$/SiN or SiOC/SiN) is about 1, and the three layers including the first to third mask forming layers can be etched to form the connecting holes 14 in one step.

However, the etching method is not limited to the above-described method. When the resist selectivity and etching conversion difference become a problem, the first, second and third mask forming layers can be successively etched by three-step etching to selectively etch a target mask forming layer relative to a lower mask forming layer or an underlying insulating film.

Furthermore, the connecting holes in the PAE film 7 are formed by a usual high-density plasma etching apparatus using, for example, ammonia (NH$_3$) as an etching gas with a RF power of 150 W and a substrate temperature of 20° C.

Under these etching conditions, the etching rate of the resist mask 12 is substantially the same as that of the PAE film 7, and thus the thickness of the resist mask 12 is decreased during the formation of the connecting holes in the PAE film 7. However, the second mask 9' (SiN film 9) functions as an etching mask to form the connecting holes having a good aperture shape.

Under the etching conditions of the PAE film 7, the etching selectivity to the SiN film, the SiO$_2$ film, and the SiOC film is 100 or more.

Figure 4E:
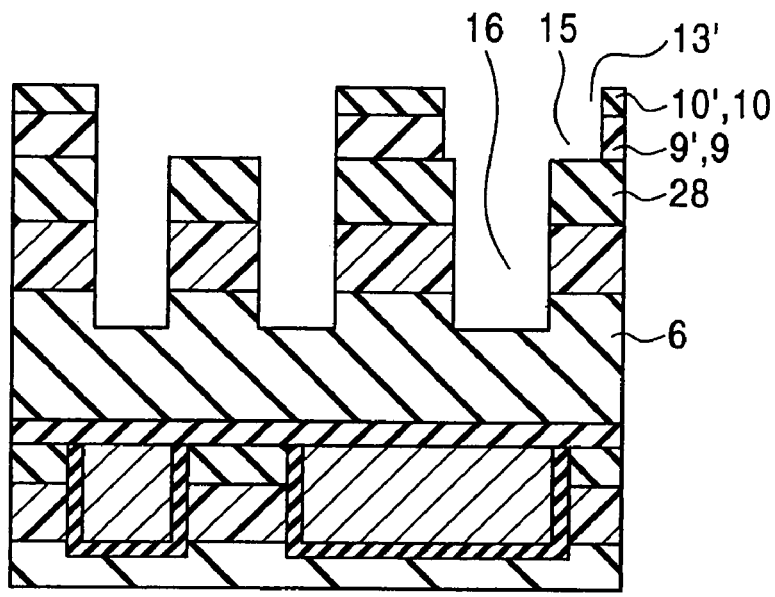
FIGS. 4E and 4F are sectional views showing respective steps after the step shown in FIG. 3D of the method for forming the wiring structure by the dual damascene process according to the first embodiment.

Next, as shown in FIG. 4E, the SiN film 9 is etched by a dry etching method using the third mask 10' (SiO$_2$ film 10) having the wiring groove pattern 13' to form the second mask 9' having a wiring groove pattern 15 on the SiOC film 28.

The SiN film 9 is etched by, for example, a general magnetron etching apparatus using difluoromethane (CH$_2$F$_2$), oxygen (O$_2$) and argon (Ar) as etching gases at a gas flow rate ratio (CH$_2$F$_2$:O$_2$:Ar) of 2:1:5 with a bias power of 100 W.

Under these conditions, the etching selectivity (SiN/SiO$_2$) to the SiO$_2$ film becomes about 3. Therefore, when the thickness of the SiO$_2$ film 10 functioning as the third mask forming layer is about 50 nm, the wiring groove pattern 15 can be formed with a sufficient margin for thinning the SiO$_2$ film 10 in etching of the SiN film 9 of 100 nm in thickness functioning as the second mask forming layer.

In the step of etching the SiN film 9 functioning as the second mask forming layer through the third mask 10', the SiOC film 6 exposed at the bottoms of the connecting holes 14 is etched to an intermediate portion to dig down the connecting holes 14 and form connecting holes 16.

Under these etching conditions, the etching selectivity (SiN/SiOC) to the SiOC film becomes slightly smaller than 1. Therefore, in etching the SiN film 9 having a thickness of 100 nm, the connecting holes 16 can be dug down in the SiOC film 6 to a depth of 150 to 200 nm including a necessary amount of over etching.

Figure 4F:
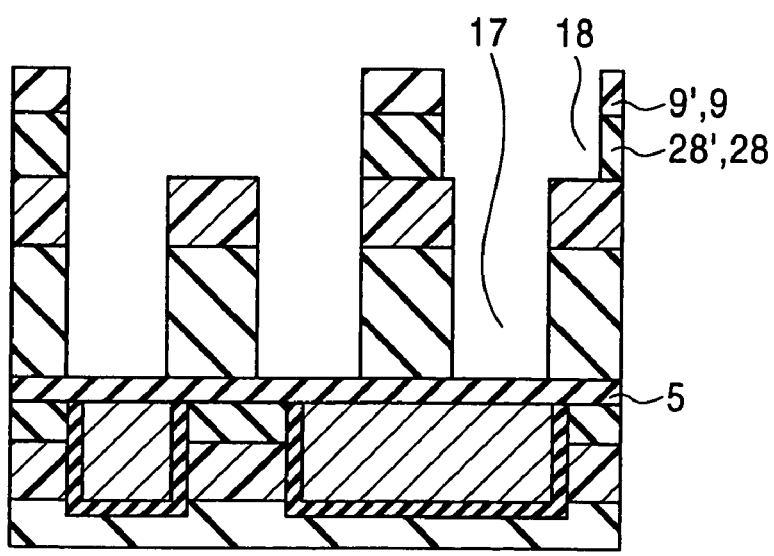

Next, the remaining lower layer of the SiOC film 6 is etched through the first mask 28' (SiOC film 28) to expose the SiC film 5 and form connecting holes 17, as shown in FIG. 4F.

At the same time, the SiOC film 28 remaining in the wiring groove region is removed by using the second mask 9' (SiN film 9) having the wiring groove pattern 15 to form a third mask 28' (SiOC film 28) having apertures 18 of the wiring groove pattern.

The etching is performed by, for example, a general magnetron etching apparatus using octafluorocyclopentene (C$_5$F$_8$), carbon monoxide (CO), argon (Ar) and oxygen (O$_2$) as etching gases at a gas flow rate ratio (C$_5$F$_8$:CO:Ar:O$_2$) of 1:10:5:1 with a bias power of 1600 W and a substrate temperature of 20° C.

Under these conditions, the etching selectivity (SiOC/SiN) of 10 or more to the SiN film can be obtained. Therefore, when the thickness of the SiN film 9 serving as the second mask for etching the SiOC film 6 remaining in a thickness of 200 nm to 250 nm at the bottoms of the connecting holes, a good aperture shape can be obtained with a sufficient margin for thinning of the SiN film 9 while suppressing widening of the upper portions or scraping of the shoulders of the wiring grooves.

Since the carbon content of the low-carbon SiOC film 28 remaining in the wiring groove region is controlled to about 6 atomic % for preventing a rapid decrease in amount of etching even in a wide aperture, no etching residue occurs in a wide aperture pattern unlike in the modification.

Figure 5G:
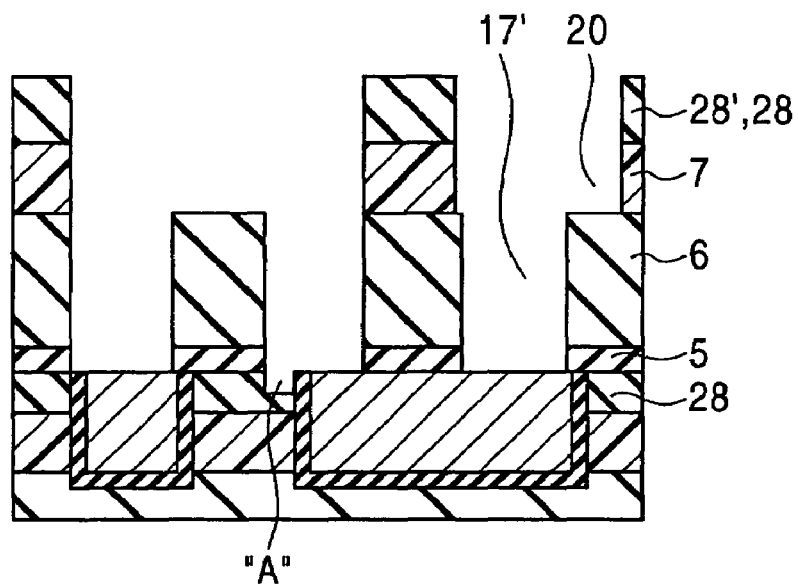
FIGS. 5G and 5H are sectional views showing respective steps after the step shown in FIG. 4F of the method for forming the wiring structure by the dual damascene process according to the first embodiment.

Then, as shown in FIG. 5G, the PAE film 7 remaining at the bottoms of the apertures 18 is etched through the third mask 28' (SiOC film 28) to form wiring grooves 20 on the SiOC film 6. At the same time, the SiC film 5 exposed at the bottoms of the connecting holes 17 can be etched to form connecting holes 17' communicating with the Cu buried wiring layer 4, thereby completing the predetermined dual damascene process.

The SiN film 9 remaining on the SiOC film 28 can be removed at the same time as etching of the SiC film 5 exposed at the bottoms of the connecting holes 17.

In this step, the SiOC film 28 is exposed from a portion where misalignment occurs between the connecting holes 17' and the lower wiring 4, as shown by "A" in FIG. 5G. However, the etching selectivity (SiC/SiOC or SiN/SiOC) of up to about 2 can be secured because the carbon content of the SiOC film 28 is controlled to about 6 atomic %, thereby preventing the occurrence of such a remarkable slit-shaped trench as produced in the modification.

For the same reason, no scraping occurs at the shoulders of the apertures 18 of the wiring pattern in the SiOC film 28 remaining below the second mask 9' (SiN film 9), and thus a good aperture shape can be obtained.

The PAE film 7 is etched to form the wiring grooves 20 by a usual high-density plasma etching apparatus using, for example, ammonia (NH$_3$) as an etching gas with a RF power of 150 W and a substrate temperature of 20° C.

Under these etching conditions, the etching selectivity to the SiOC film 28 becomes 100 or more, and thus the wiring grooves can be formed with high controllability and no variation in depth.

The SiC film 5 exposed at the bottoms of the connecting holes 17 is etched by, for example, a general magnetron etching apparatus using difluoromethane (CH$_2$F$_2$), oxygen (O$_2$) and argon (Ar) as etching gases at a gas flow rate ratio (CH$_2$F$_2$:O$_2$:Ar) of 2:1:5 with a bias power of 100 W.

However, under these etching conditions, the selectivity to the SiOC film 6 is about 1, and thus the SiC film 5 can be etched before the wiring grooves are formed in the PAE film 7 when trenches produced in the SiOC film 6 near the bottoms of the wiring grooves 20 become a problem.

Figure 5H:
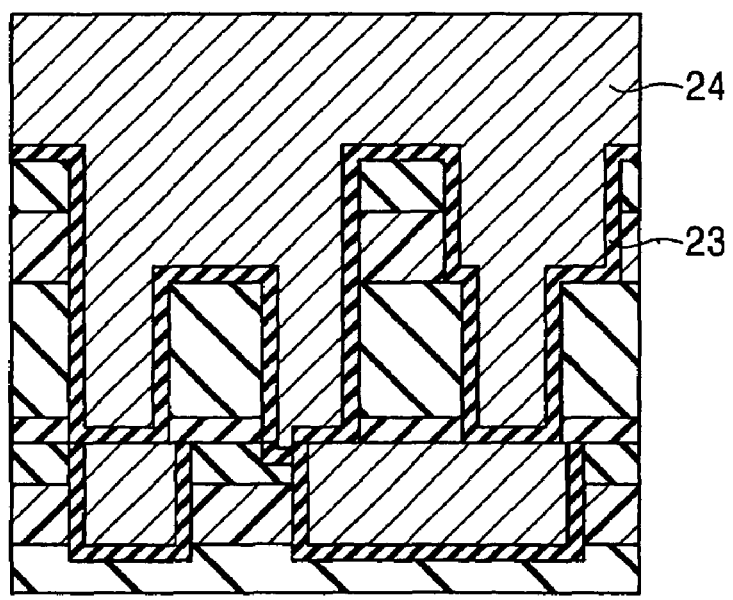

Then, the extraneous matters remaining after etching on the side walls of the wiring grooves 20 and the connecting holes 17 are removed by a post-treatment with an appropriate chemical and RF sputtering to convert the Cu affected layers at the bottoms of the connecting holes 17' to normal Cu layers. Then, as shown in FIG. 5H, for example, a Ta film 23 is deposited as a barrier metal by sputtering, and a Cu film 24 is deposited by an electrolytic plating or sputtering method to bury an electrically conductive film in the connecting holes 17' and the wiring grooves 20 at a time.

Furthermore, portions of the deposited Ta film 23 and Cu film 24, which are unnecessary as the wiring pattern, are removed by a chemical mechanical polishing (CMP) method to form the dual damascene multi-layer wiring structure shown in FIG. 1.

In this embodiment, the final thickness of the upper wiring is controlled to, for example, about 250 nm. Like in the lower wiring pattern, for example, a SiC film 27 is deposited as an antioxidative layer on the dual damascene wiring 18.

In this embodiment, the carbon content of the SiOC film 28 is controlled to 6 atomic %, and thus the rate of etching for forming the apertures 18 shown in FIG. 4F can be increased for preventing the SiOC film 28 from remaining in a wide wiring groove. Also, since the carbon content of the SiOC film 28 is controlled to 6 atomic %, the etching selectivity of SiC film/SiOC film or SiN film/SiOC film can be maintained at 1.5 or more. Therefore, when the connecting holes 17 shown in FIG. 5G are formed, it is possible to prevent the occurrence of a slit-shaped trench in the inter-wiring insulating film of the lower wiring or scraping of the aperture shoulders of the wiring grooves 20 of the upper wiring. Thus, the wiring structure having the predetermined shape can easily be formed by the dual damascene process.

Furthermore, the SiOC film 28 is used instead of a conventional $SiO_2$ film (relative dielectric constant 4.1), and the carbon content of the SiOC film 28 is controlled to 6 atomic % to decrease the relative dielectric constant of the SiOC film 28 to 3.5, thereby decreasing the relative dielectric constant of the inter-wiring insulating film comprising the PAE film 7 and the SiOC film 28. Therefore, the inter-wiring capacity of each of the lower and the upper wiring layers can be decreased by about 5 to 10%, as compared with a wiring structure formed by a conventional dual damascene process.

In the dual damascene multi-layer wiring structure formed through the above-described steps, when the resist mask 12 having the connecting hole pattern is formed, the step difference of the underlying layer can be suppressed to about 50 nm equal to the thickness of the remaining $SiO_2$ film 10, and thus the resist mask having the high-precision connecting hole pattern can be formed. By using the resist mask having the high-precision connecting hole pattern, the connecting holes with micro dimensions can be stably formed without deteriorating the shape of the wiring grooves.

As a result, good via contact characteristics can be obtained.

In this embodiment, the types, thicknesses and production methods of the insulating films are not limited. For example, the carbon content of the SiOC film 28 deposited as the protective layer and the first mask forming layer functioning as the third insulating film on the PAE film 2 or 7 is preferably 3 atomic % to 9 atomic % from the viewpoint of processing characteristics and the effect of decreasing the inter-wiring capacity, and the carbon content is not limited to 6 atomic %.

The method for depositing the SiOC film 28 is not limited to the plasma CVD using the parallel plate plasma CVD apparatus, and a high-density plasma CVD method or a spin coating method may be used for deposition.

Semiconductor Device of Second Embodiment

Figure 6:
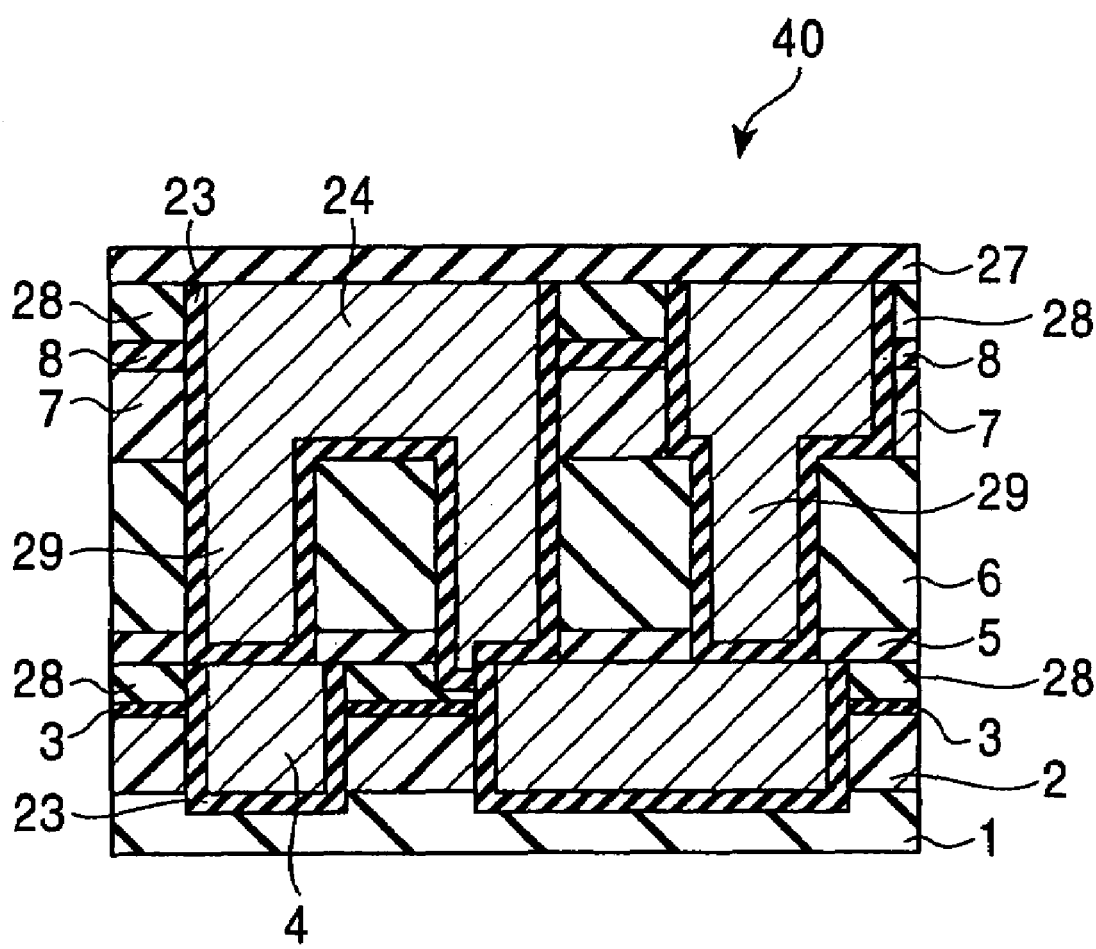
FIG. 6 is a sectional view showing the configuration of a semiconductor device according to a second embodiment of the present invention.

A semiconductor device according to a second embodiment of the present invention will be described below. FIG. 6 is a sectional view showing the configuration of the semiconductor device of this embodiment. In FIG. 6, the same portions as those shown in FIG. 1 are denoted by the same reference numerals.

As shown in FIG. 6, a semiconductor device 40 of this embodiment comprises the same configuration as that of the semiconductor device 30 of the first embodiment except the structure of an inter-wiring insulating film. Namely, the semiconductor device 40 of this embodiment has a wiring structure comprising a lower Cu buried wiring layer 4, a SiC film 5 deposited to a thickness of 50 nm as an antioxidative film for the lower Cu buried wiring layer 4, a SiOC film 6 of 400 nm in thickness functioning as an interlayer insulating film, and an upper Cu buried wiring layer 23/24 electrically connected to the lower Cu buried wiring layer 4 through contact plugs 29 passing through the SiC film 5 and the SiOC film 6, the contact plugs 29 and the upper Cu buried wiring layer 23/24 being formed in a single burying step of a dual damascene method.

The SiOC film 6 has a carbon content of about 12 atomic % and a relative dielectric constant of about 3.0.

In this embodiment, the lower Cu buried wiring layer 4 is formed by burying a Cu film, through a barrier metal 23, in wiring grooves which are provided in a laminated insulating film formed on an underlying insulating film 1, the laminated insulating film including an organic insulating film, for example, a PAE film 2 of 200 nm in thickness, a SiOC film 3 of 20 nm in thickness, and a SiOC film 28 of 30 nm in thickness, and the lower buried wiring layer 4 having a wiring thickness of 250 nm.

The SiOC film 3 has a carbon content of about 12 atomic % and a relative dielectric constant of about 3.0, while the SiOC film 28 has a carbon content of about 6 atomic % and a relative dielectric constant of about 3.5. The SiOC film 28 is first deposited to a thickness of 130 nm on the SiOC film 3, and then the Cu film is buried in the wiring grooves and polished by a CMP process under the condition that the finished thickness of the remaining SiOC film 28 is set to 30 nm. This applies to the inter-wiring insulating film of the upper Cu buried wiring layer 24 described below.

The PAE film 2 is an organic insulating film having a relative dielectric constant of about 2.6. In FIG. 6, reference numeral 5 denotes an antioxidative film of 50 nm in thickness for protecting the lower Cu buried wiring layer 4 during the formation of the upper Cu buried wiring layer 24 by the dual damascene process.

The upper Cu buried wiring layer 24 is formed by burying a Cu film, through a barrier metal 23, in wiring grooves provided in an inter-wiring insulating film comprising a laminated film including a PAE film 7 of 200 nm in thickness, a SiOC film 8 of 20 nm in thickness, and a SiOC film 28 of 30 nm in thickness.

The SiOC film 8 has a carbon content of about 12 atomic % and a relative dielectric constant of about 3.0. The PAE film 7 is an organic insulating film having a relative dielectric constant of about 2.6.

In the semiconductor device 40 of this embodiment, the laminated insulating film including the PAE film 2 or 7, the SiOC film 8 having a relative dielectric constant of 3.5, and the SiOC film 28 having a relative dielectric constant of 3.0 is used as the inter-wiring insulating film of each of the lower Cu buried wiring layer 23/4 and the upper Cu buried wiring layer 23/24, instead of a conventional laminated insulating film including the PAE film 2 or 7 and a $SiO_2$ film (relative dielectric constant 4.1). Therefore, the inter-wiring capacity of each of the lower wiring and upper wiring can be decreased by about 8 to 13%, as compared with a wiring structure formed by a conventional dual damascene process. The inter-wiring capacity can be further decreased as compared with the semiconductor device of the first embodiment.

The types, thicknesses and deposition methods of the inter-wiring insulating films of the semiconductor device 40 of the second embodiment are not limited. For example, the SiOC film 28 deposited on the PAE film 2 or 7 preferably has a carbon content of 3 atomic % to 9 atomic % from the viewpoint of processing characteristics and the effect of decreasing the inter-wiring capacity, and the carbon content is not limited to 6 atomic %. Also, the carbon content of the SiOC film 8 is not limited to 12 atomic %.

The description below concerns the semiconductor devices of both the first and second embodiments.

Although, in each of the semiconductor devices 30 and 40 of the first and second embodiments, the SiC film 5 or 27 is provided as the antioxidative layer for the Cu film, a SiN film may be deposited by a CVD process, and the SiC film may contain a light element such as nitrogen ($N_2$), hydrogen (H), or the like or comprise a laminated structure of these films.

As the SiOC film 6 functioning as the interlayer insulating film of the through hole portion, for example, a SiOF film or $SiO_2$ film deposited by a CVD process, or a MSQ film or HSQ film deposited by a spin coating process may be used instead of the SiOC film.

As the PAE film 7 functioning as the inter-wiring insulating film of the upper Cu buried wiring layer 23/24, a polyarylene ether film, an amorphous carbon film, or a polytetrafluoroethylene film can be used instead of the PAE film. Also, a xerogel film, a MSQ film having a porous structure, an organic polymer, or the like may be used, or a laminated film of these films may be used.

Method for Manufacturing the Semiconductor Device of the Second Embodiment

In this embodiment, a method for manufacturing a semiconductor device of the present invention is applied to a method for manufacturing the semiconductor device of the second embodiment. FIGS. 7A and 7B, FIGS. 8C and 8D, FIGS. 9E and 9F, and FIGS. 10G and 10H are sectional views showing respective steps of the method of this embodiment for forming a wiring structure by the dual damascene process.

Figure 7A:
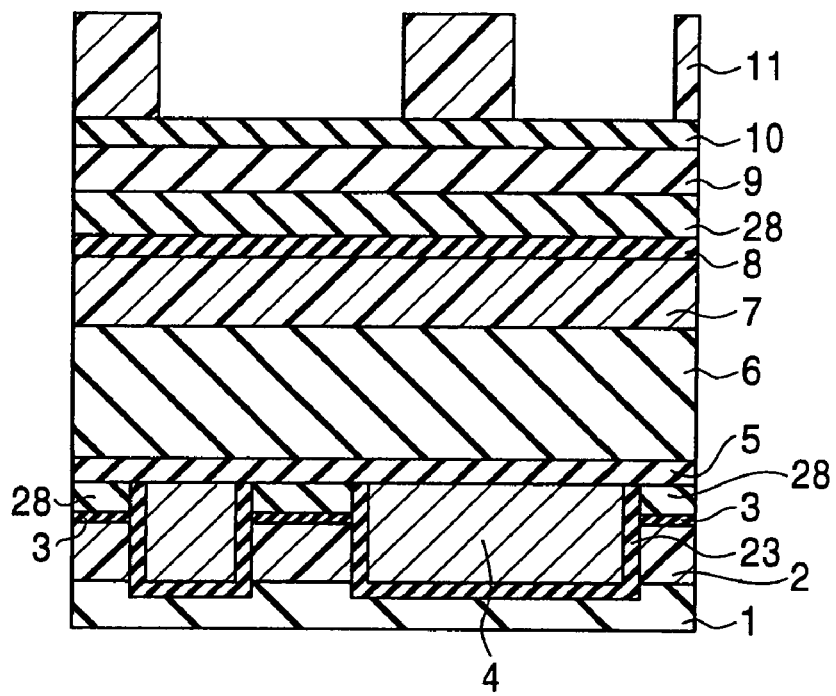
FIGS. 7A and 7B are sectional views showing respective steps of a method for forming a wiring structure by a dual damascene process according to the second embodiment.

Like in the first embodiment, as shown in FIG. 7A, the laminated film of an organic insulating film, for example, the PAE film 2, the SiOC film 3 having a carbon content of about 12 atomic %, and the SiOC film 28 having a carbon content of about 6 atomic % is deposited as the inter-wiring insulating film on the underlying insulating film 1 which is deposited on a substrate not shown in the drawing. Then, the lower copper (Cu) buried-wiring layer 4 having a wiring thickness of 250 nm is formed.

Each of the SiOC film 3 and the SiOC film 28 is deposited by a parallel plate plasma CVD apparatus as a deposition apparatus using trimethylsilane as a silicon source at a trimethylsilane/oxygen flow rate ratio of about 2:1 for depositing the SiOC film 3 and a trimethylsilane/oxygen flow rate ratio of about 1:1 for depositing the SiOC film 28.

The deposition conditions include a substrate temperature of 350° C., a plasma power of 300 W, and a deposition ambient pressure of about 500 Pa.

Under these deposition conditions, the SiOC film 3 and the SiOC film 28 having relative dielectric constants of about 3.0 and 3.5, respective, can be deposited.

The SiOC film 28 is first deposited to a thickness of 130 nm on the SiOC film 3, and then a Cu film is buried in the wiring grooves and polished by a CMP process under the condition that the finished thickness of the remaining SiOC film 28 is set to 30 nm.

Then, the silicon carbide (SiC) film 5 of 50 nm in thickness, the carbon-containing silicon oxide film (SiOC) film 6 of 400 nm in thickness, and the polyaryl ether (PAE) film 7 as an organic polymer film having a relative dielectric constant of about 2.6 and a thickness of 200 nm are deposited on the Cu wiring layer 4 by the same method as in the first embodiment.

Then, in this embodiment, the SiOC film 8 having a carbon content of 12 atomic % and a thickness of 20 nm and the SiOC film 28 having a carbon content of 6 atomic % and a thickness of 130 nm are deposited to form a laminated film functioning as a protective layer for the PAE film 7 and as a first mask forming layer functioning as a third insulating film.

Then, a silicon nitride film (SiN) film 9 of 100 nm in thickness functioning as a second mask forming layer, and a silicon oxide ($SiO_2$) film 10 of 50 nm in thickness functioning as a third mask forming layer are successively deposited.

Then, a resist mask 11 having the wiring groove pattern as a resist pattern is formed on the $SiO_2$ film 10.

The SiOC film 8 and the SiOC film 28 are deposited to form the first mask forming layer functioning as the third insulating film by the same method as that used for depositing the SiOC film 3 and the SiOC film 28 on the PAE film 2 of the lower wiring layer. In this case, the SiOC films 3 and 28 having relative dielectric constants of about 3.0 and 3.5, respectively, can be deposited.

Like in the first embodiment, the $SiO_2$ film 10 functioning as the third mask forming layer can be deposited by a plasma CVD method using, for example, monosilane ($SiH_4$) as a silicon source and dinitrogen monoxide ($N_2O$) gas as an oxidizing agent.

Like in the first embodiment, the SiN film 9 functioning as the second mask forming layer can be deposited by the same plasma CVD apparatus as that used for the $SiO_2$ film 10 using, for example, monosilane ($SiH_4$) as a silicon source, ammonia ($NH_3$) gas as an nitriding agent, dinitrogen monoxide ($N_2O$) gas as an oxidizing agent, and an inert gas as a carrier gas.

Figure 7B:
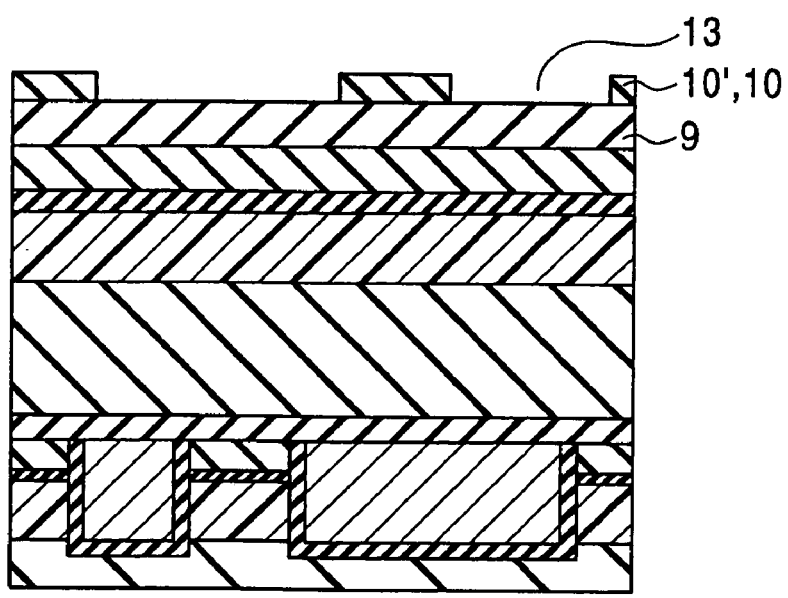

Next, as shown in FIG. 7B, the $SiO_2$ film 10 is etched by a dry etching method through the resist mask 11 to form a third mask 10' having a wiring groove intermediate pattern 13.

Like in the first embodiment, the $SiO_2$ film 10 is etched through the resist mask 11 by a general magnetron etching apparatus using, for example, octafluorobutane ($C_4F_8$), carbon monoxide (CO) and argon (Ar) as etching gases at a gas flow rate ratio ($C_4F_8$:CO:Ar) of 1:5:20 with a bias power of 1200 W and a substrate temperature of 20° C.

Under these etching conditions, an etching selectivity ($SiO_2$/SiN) of 10 or more to the SiN film can be obtained, and thus the SiN film 9 functioning as the second mask forming layer is little etched.

After etching of the $SiO_2$ film 10, the resist mask 11 and extraneous matters remaining after etching can be completely removed by, for example, ashing with oxygen ($O_2$) plasma used as a base and a treatment with an organic amine chemical.

Figure 8C:
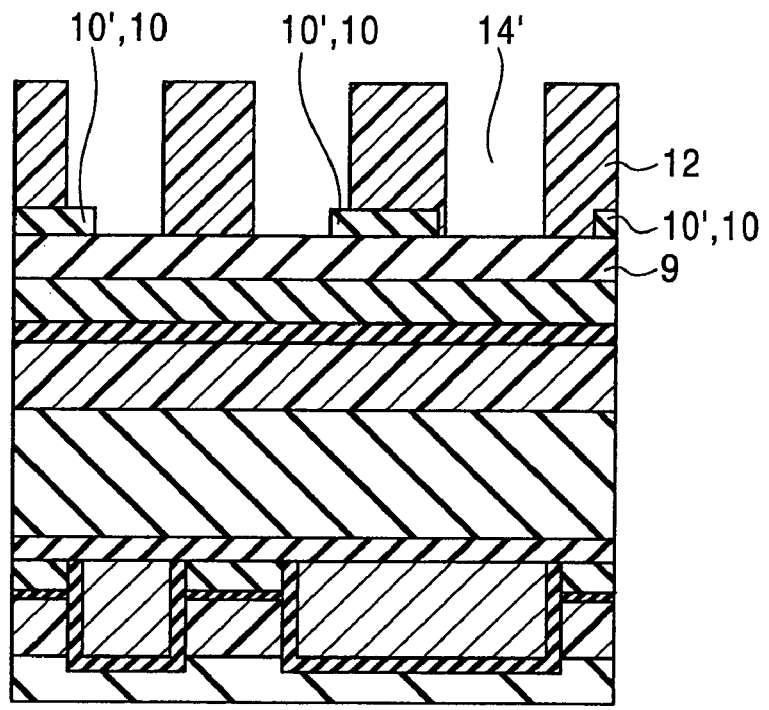
FIGS. 8C and 8D are sectional views showing respective steps after the step shown in FIG. 7B of the method for forming the wiring structure by the dual damascene process according to the second embodiment.

Like in the first embodiment, as shown in FIG. 8C, a resist mask 12 having a connecting hole pattern 14' is next formed on the remaining $SiO_2$ film 10 and the SiN film 9 so that at least a portion of the connecting hole pattern 14' overlaps with the third mask 10' ($SiO_2$ film 10) constituting a wiring groove intermediate pattern 13.

In forming the resist mask 12, a step difference formed by the $SiO_2$ film 10 constituting the wiring groove intermediate pattern 13 is suppressed to about 50 nm approximately equal to the thickness of the $SiO_2$ film 10, and thus a good resist pattern for the connecting holes can be formed with the lithography characteristics substantially equal to those for forming a resist mask on a flat portion.

Also, even when a coat-type anti-reflection film (BARC) is combined, variations in the buried shape of the BARC can be suppressed to a low level by controlling the dimensions and density of the wiring groove intermediate pattern 13, and thus a deterioration in shape of the resist during exposure and a variation in the focal depth, which causes a dimensional variation, can be decreased.

Figure 8D:
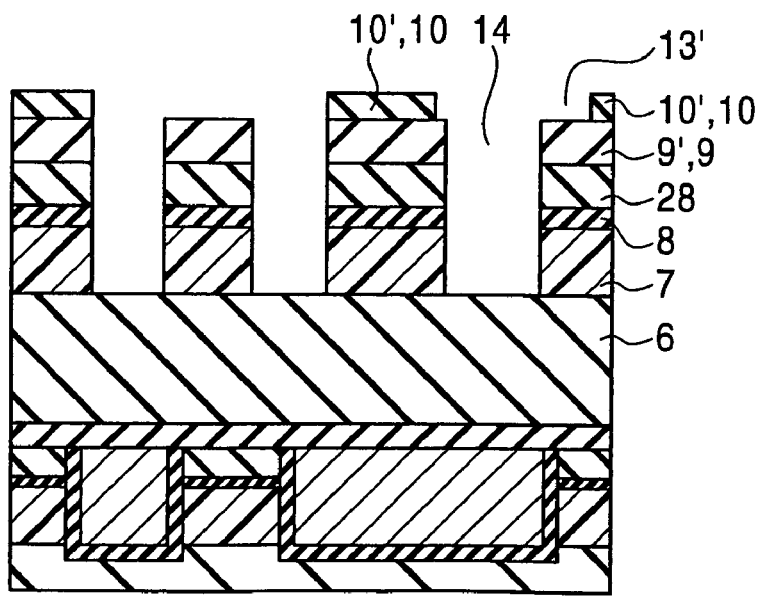

Then, the third mask 10' ($SiO_2$ film 10) remaining in the connecting hole region, the SiN film 9 functioning as the second mask forming layer, and the laminate of the SiOC films 28 and 8 functioning as the first mask forming layer are etched by a dry etching method using the resist mask 12 having the connecting hole pattern 14'. Then, the PAE film 7 is etched by using the remaining SiN film 9 as a second mask to form connecting holes 14 for exposing the SiOC film 6, as shown in FIG. 8D.

The resist mask 12 can be removed at the same time as etching of the PAE film 7.

The remaining $SiO_2$ film 10 constitutes the third mask 10, having a wiring groove pattern 13', and the etched SiN film 9 constitutes the second mask 9' having the connecting hole pattern.

In etching the layers ranging from the $SiO_2$ film 10 to the SiOC films 28 and 8 to form the connecting holes 14, a general magnetron etching apparatus is used, and, for example, octafluorobutane ($C_4F_8$) and argon (Ar) are used as etching gases at a gas flow rate ratio ($C_4F_8$:Ar) of 1:4 with a bias power of 400 W and a substrate temperature of 20° C.

In this embodiment, under these etching conditions, the etching selectivity ($SiO_2$/SiN or SiOC/SiN) is about 1, and the three layers including the first to third mask forming layers can be etched to form the connecting holes 14 in one step.

However, the etching method is not limited to the above-described method. When the resist selectivity and etching conversion difference become a problem, the first, second and third mask forming layers can be successively etched by three etching steps to selectively etch a target mask forming layer relative to a lower mask forming layer or an underlying insulating film.

Furthermore, like in the first embodiment, the connecting holes in the PAE film 7 are formed by a usual high-density plasma etching apparatus using, for example, ammonia ($NH_3$) as an etching gas with a RF power of 150 W and a substrate temperature of 20° C.

Under these etching conditions, the etching rate of the resist mask 12 is substantially the same as that of the PAE film 7, and thus the thickness of the resist mask 12 is decreased during the formation of the connecting holes in the PAE film 7. However, the second mask (SiN film 9) functions as an etching mask to form the connecting holes having a good aperture shape.

Under the etching conditions of the PAE film 7, the etching selectivity to the SiN film, the $SiO_2$ film, and the SiOC film is 100 or more.

Figure 9E:
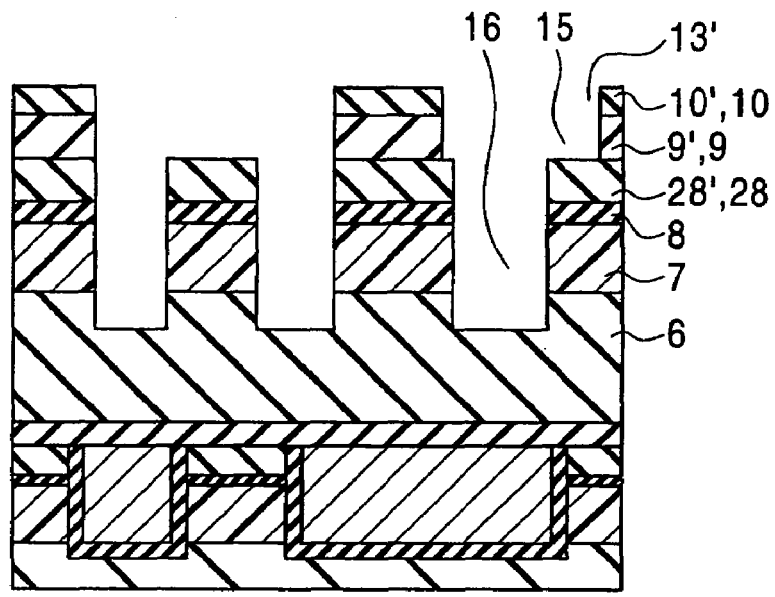
FIGS. 9E and 9F are sectional views showing respective steps after the step shown in FIG. 8D of the method for forming the wiring structure by the dual damascene process according to the second embodiment.

Like in the first embodiment, as shown in FIG. 9E, the SiN film 9 is next etched by a dry etching method using the third mask 10' ($SiO_2$ film 10) having the wiring groove pattern 13' to form the second mask 9' having a wiring groove pattern 15.

The SiN film 9 is etched by, for example, a general magnetron etching apparatus using, for example, difluoromethane ($CH_2F_2$), oxygen ($O_2$) and argon (Ar) as etching gases at a gas flow rate ratio ($CH_2F_2$:$O_2$:Ar) of 2:1:5 with a bias power of 100 W.

Under these conditions, the etching selectivity (SiN/$SiO_2$) to the $SiO_2$ film becomes about 3. Therefore, when the thickness of the $SiO_2$ film 10 functioning as the third mask forming layer is about 50 nm, the wiring groove pattern 15 can be formed with a sufficient margin for thinning the $SiO_2$ film 10 during etching of the SiN film 9 of 100 nm in thickness functioning as the second mask forming layer.

In the step of etching the SiN film 9 functioning as the second mask forming layer using the third mask 10' ($SiO_2$ film 10), the SiOC film 6 exposed at the bottoms of the connecting holes 14 is etched to an intermediate portion to dig down the connecting holes 14 and form connecting holes 16.

Under these etching conditions, the etching selectivity (SiN/SiOC) to the SiOC film becomes slightly smaller than 1. Therefore, in etching the SiN film 9 having a thickness of 100 nm, the connecting holes 16 can be dug down in the SiOC film 6 to a depth of 150 to 200 nm including a necessary amount of over etching.

Figure 9F:
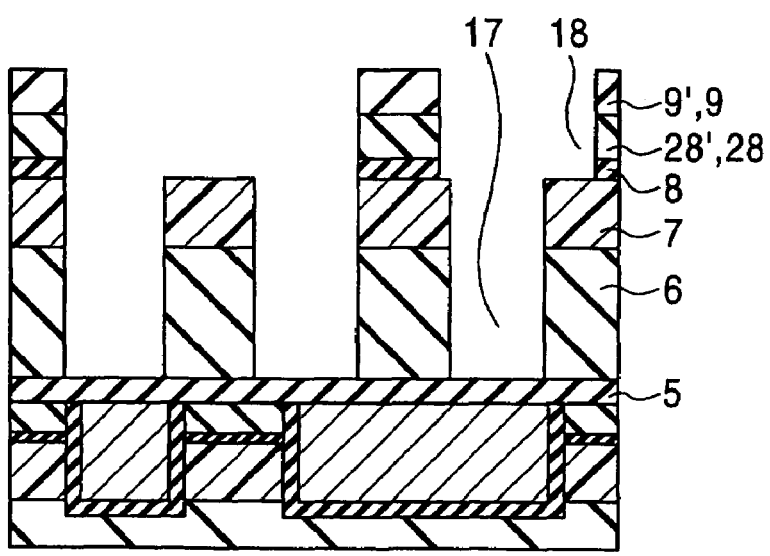

Next, the remaining lower layer of the SiOC film 6 is etched through the first mask 28' (SiOC film 28) to form connecting holes 17 for exposing the SiC film 5, as shown in FIG. 9F.

At the same time, the first mask 28' (SiOC film 28) and the SiOC film 8 remaining in the wiring groove region are simultaneously removed by using the second mask 9' (SiN film 9) having the wiring groove pattern 15 to form apertures 18.

The etching is performed by, for example, a general magnetron etching apparatus using octafluorocyclopentene ($C_5F_8$), carbon monoxide (CO), argon (Ar) and oxygen ($O_2$) as etching gases at a gas flow rate ratio ($C_5F_8$:CO:Ar:$O_2$) of 1:10:5:1 with a bias power of 1600 W and a substrate temperature of 20° C.

Under these conditions, the etching selectivity (SiOC/SiN) of 10 or more to the SiN film can be obtained. Therefore, when the SiOC film 6 remaining in a thickness of 200 nm to 250 nm at the bottoms of the connecting holes is etched through the second mask 9' (SiN film 9) having a thickness of 100 nm, a good aperture shape can be obtained with a sufficient margin for thinning the SiN film 9 while suppressing widening of the upper portions or scraping of the shoulders of the wiring grooves.

Since the carbon content of the low-carbon-content SiOC film 28 remaining in the wiring groove region is controlled to about 6 atomic % for preventing a rapid decrease in amount of etching in a wide aperture as described in Experimental Example 1, no etching residue occurs in a wide aperture pattern unlike in the modification.

Even if the SiOC film 8 slightly remains in this step, the remaining SiOC film 8 can be removed at the same time as the subsequent step of etching the SiC film 5 exposed at the bottoms of the connecting holes 17 and the PAE film 7 by using the second mask 9' (SiN film 9).

Figure 10G:
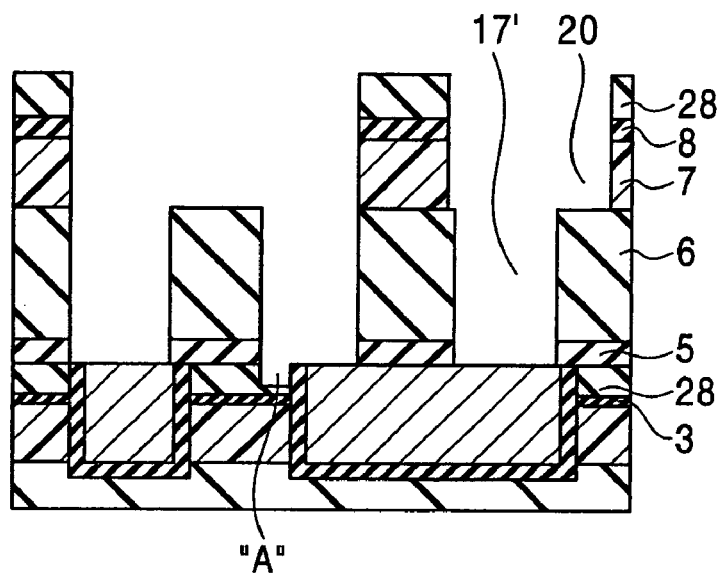
FIGS. 10G and 10H are sectional views showing respective steps after the step shown in FIG. 9F of the method for forming the wiring structure by the dual damascene process according to the second embodiment.

Then, as shown in FIG. 10G, the PAE film 7 remaining at the bottoms of the apertures 18 is etched through the second mask 9' (SiN film 9) to form wiring grooves 20. At the same time, the SiC film 5 exposed at the bottoms of the connecting holes 17 is etched to form connecting holes 17' communicating with the Cu buried wiring layer 4, thereby completing the predetermined dual damascene process.

The SiN film 9 remaining on the SiOC film 28 can be removed at the same time as etching of the SiC film 5 exposed at the bottoms of the connecting holes 17.

In this step, the SiOC film 28 is exposed immediately below the SiC film 5 in a portion where misalignment occurs between the connecting hole 17' and the lower wiring 4, as shown by A in FIG. 10G. However, the etching selectivity (SiC/SiOC or SiN/SiOC) of up to about 2 can be secured because the carbon content of the SiOC film 28 is controlled to about 6 atomic %, thereby causing only a small trench unlike a remarkable slit-shaped trench produced in the modification.

For the same reason, unlike in the modification, no scraping of the aperture shoulders occurs in the wiring pattern in the SiOC film 28 remaining below the second mask 9' (SiN film 9), and thus a good aperture shape can be obtained.

Like in the first embodiment, the PAE film 7 is etched to form the wiring grooves 20 by a usual high-density plasma etching apparatus using, for example, ammonia ($NH_3$) as an etching gas with a RF power of 150 W and a substrate temperature of 20° C.

Under these etching conditions, the etching selectivity to the SiOC film 28 becomes 100 or more, and thus the wiring grooves can be formed with high controllability and no variation in depth.

Like in the first embodiment, the SiC film 5 exposed at the bottoms of the connecting holes 17 is etched by, for example, a general magnetron etching apparatus using difluoromethane ($CH_2F_2$), oxygen ($O_2$) and argon (Ar) as etching gases at a gas flow rate ratio ($CH_2F_2:O_2:Ar$) of 2:1:5 with a bias power of 100 W.

However, under these etching conditions, the selectivity to the SiOC film 6 is about 1, and thus the SiC film 5 can be etched before the wiring grooves are formed in the PAE film 7 when trenches produced in the SiOC film 6 near the bottoms of the wiring grooves 20 become a problem.

Figure 10H:
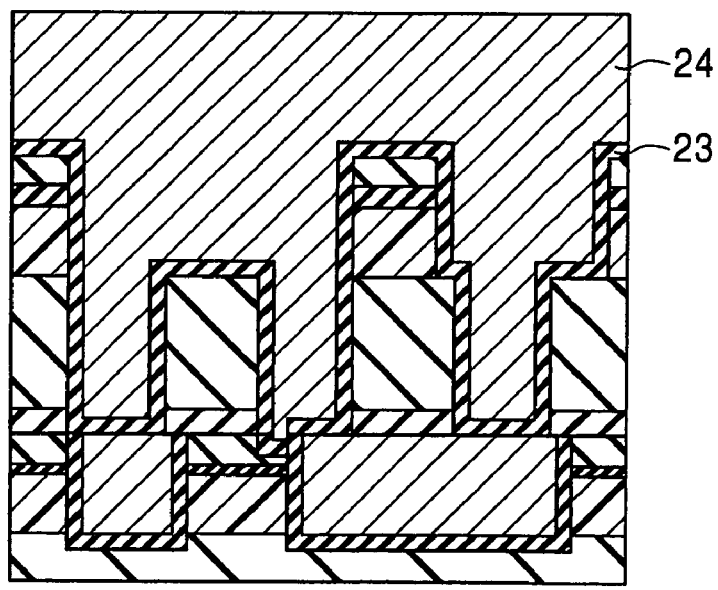
Figure 11A:
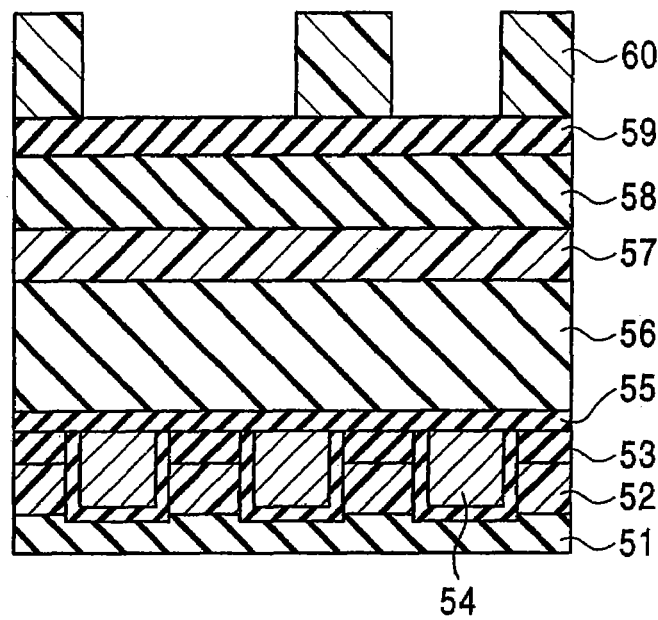
FIGS. 11A and 11B are sectional views showing respective steps of a conventional method for forming a wiring structure by a dual damascene process.
Figure 11B:
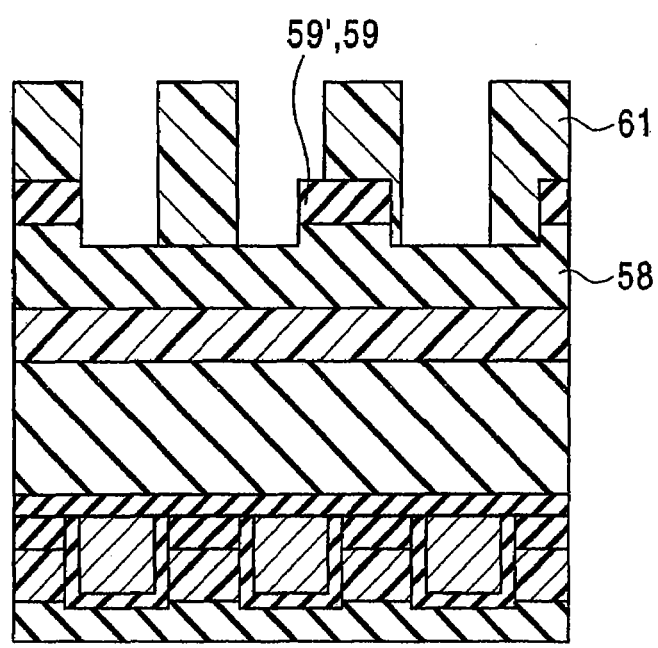
Figure 12C:
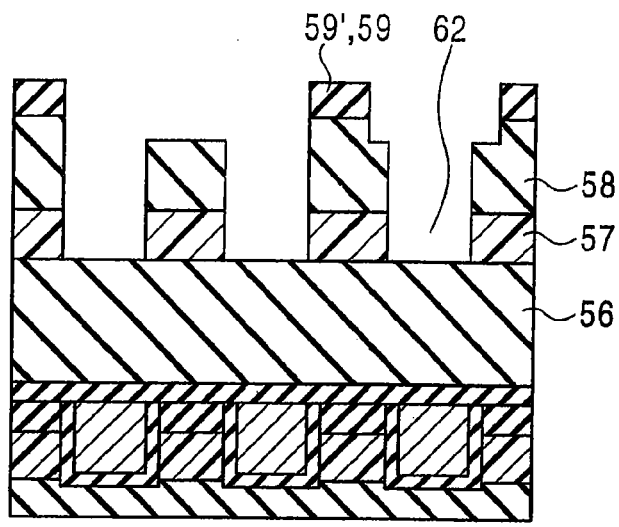
FIGS. 12C to 12E are sectional views showing respective steps after the step shown in FIG. 11B of the conventional method for forming the wiring structure by the dual damascene process.
Figure 12D:
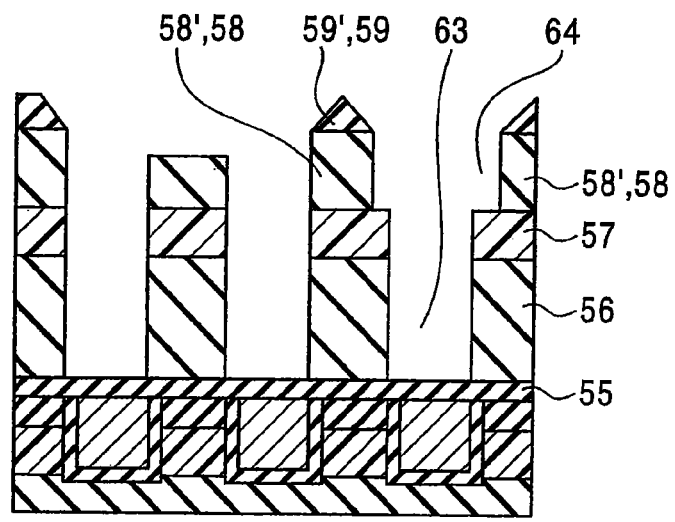
Figure 12E:
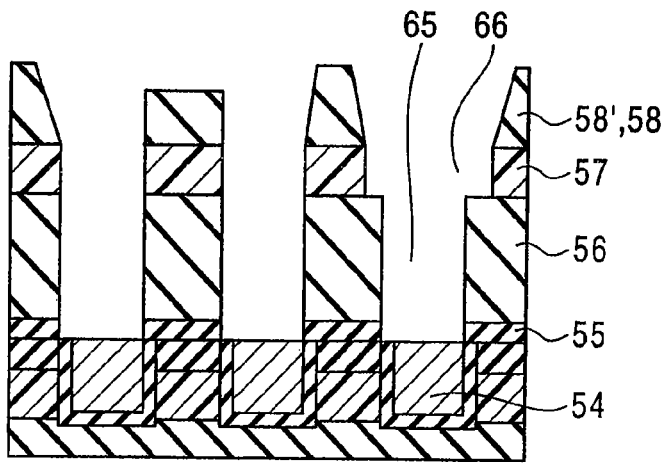
Figure 13F:
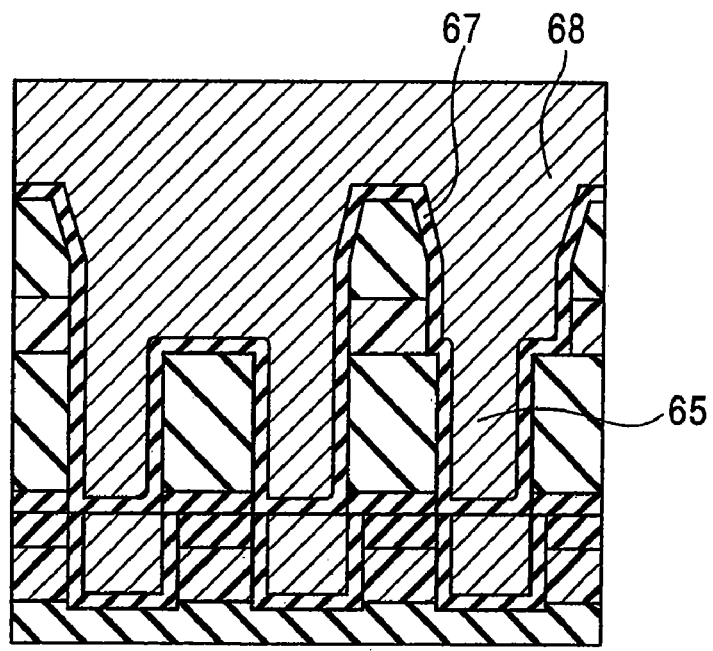
FIGS. 13F to 13G are sectional views showing respective steps after the step shown in FIG. 12E of the conventional method for forming the wiring structure by the dual damascene process.
Figure 13G:
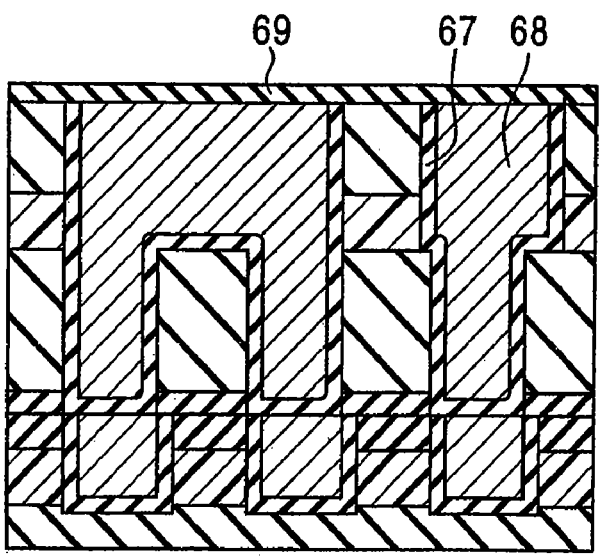
Figure 14A:
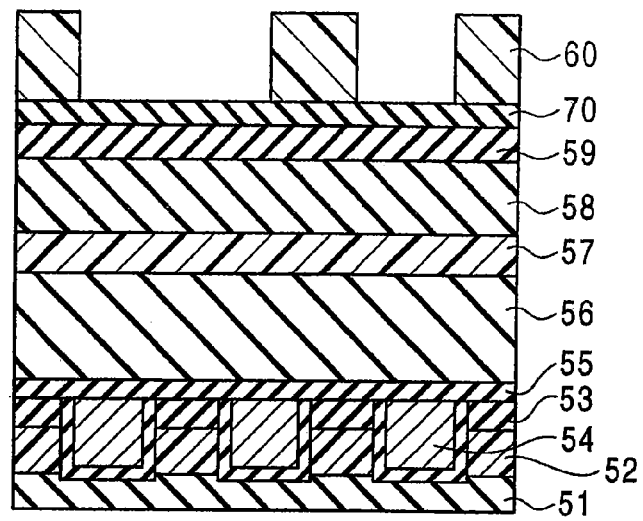
FIGS. 14A to 14C are sectional views showing respective steps of the prior-application method for forming a wiring structure by a dual damascene process.
Figure 14B:
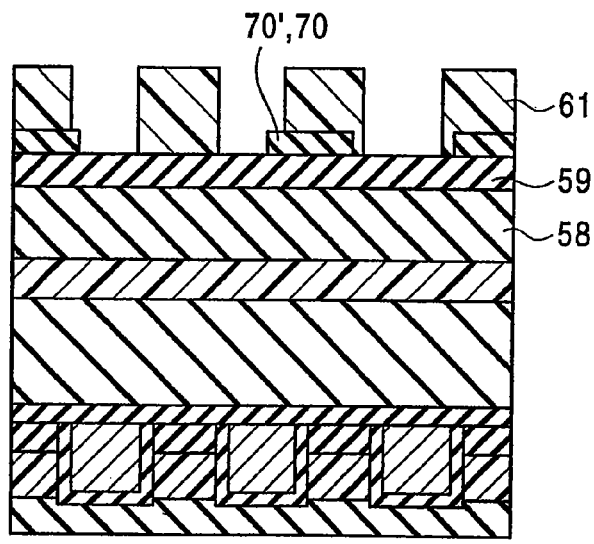
Figure 14C:
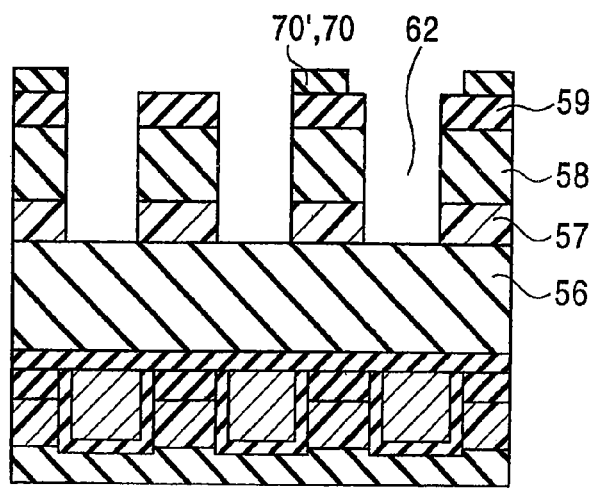
Figure 15D:
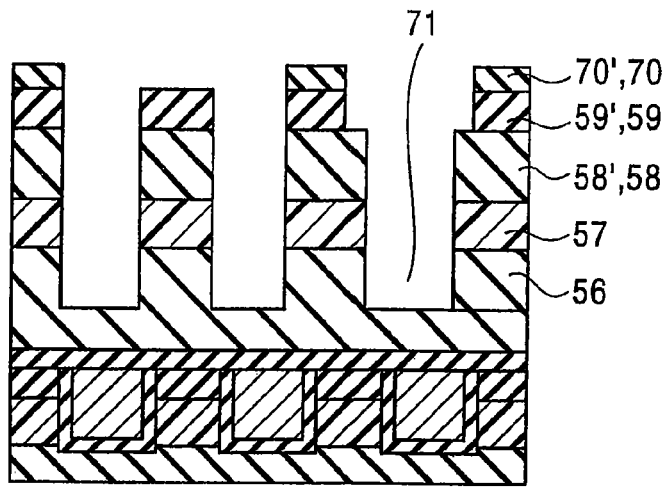
FIGS. 15D to 15F are sectional views showing respective steps after the step shown in FIG. 14C of the prior-application method for forming the wiring structure by the dual damascene process.
Figure 15E:
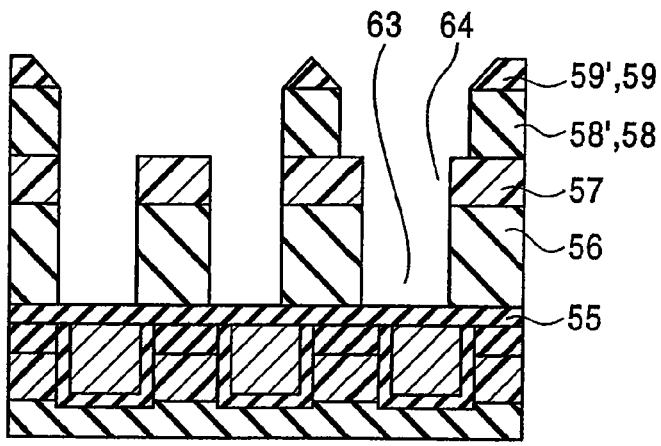
Figure 15F:
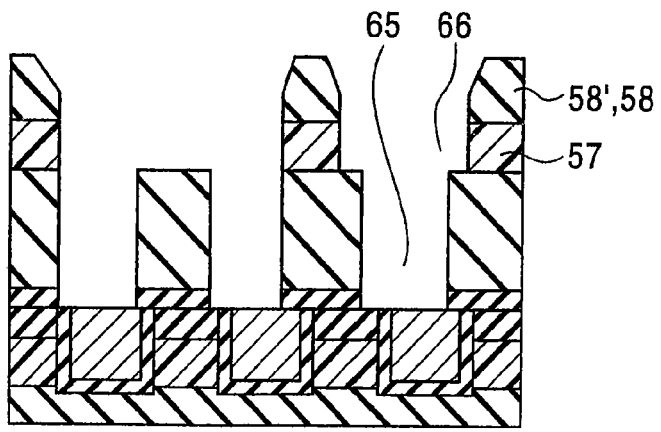
Figure 16A:
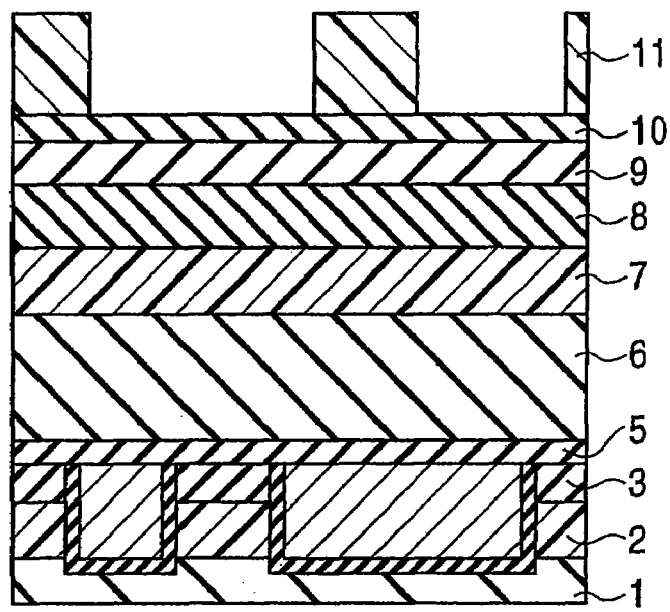
FIGS. 16A and 16B are sectional views showing respective steps of a modification of the prior-application method for forming the wiring structure by the dual damascene process.
Figure 16B:
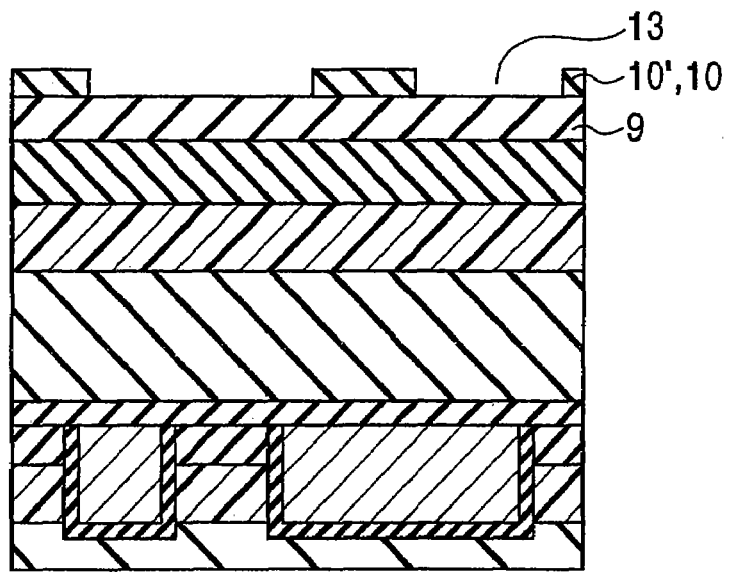
Figure 17C:
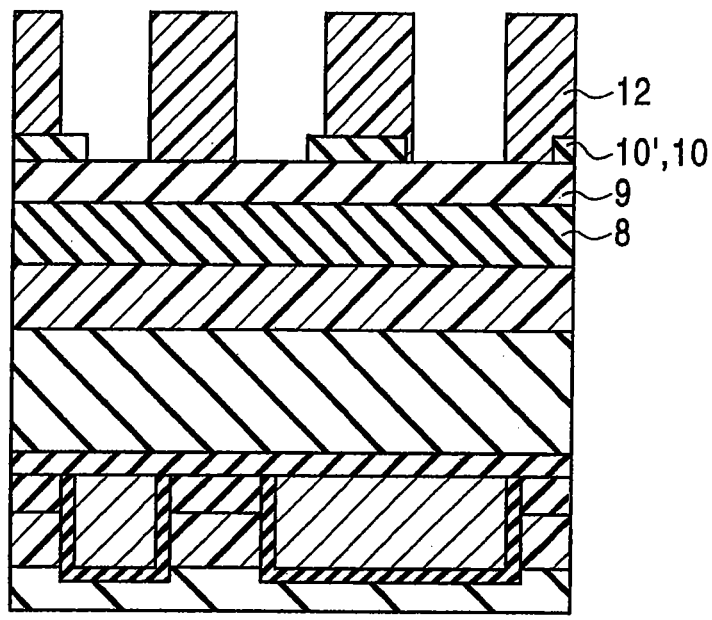
FIGS. 17C and 17D are sectional views showing respective steps after the step shown in FIG. 16B of the modification of the prior-application method for forming the wiring structure by the dual damascene process.
Figure 17D:
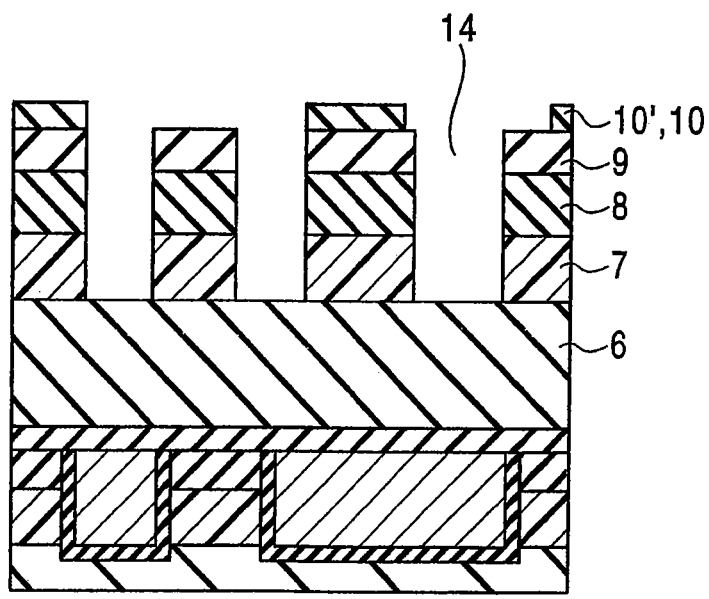
Figure 18E:
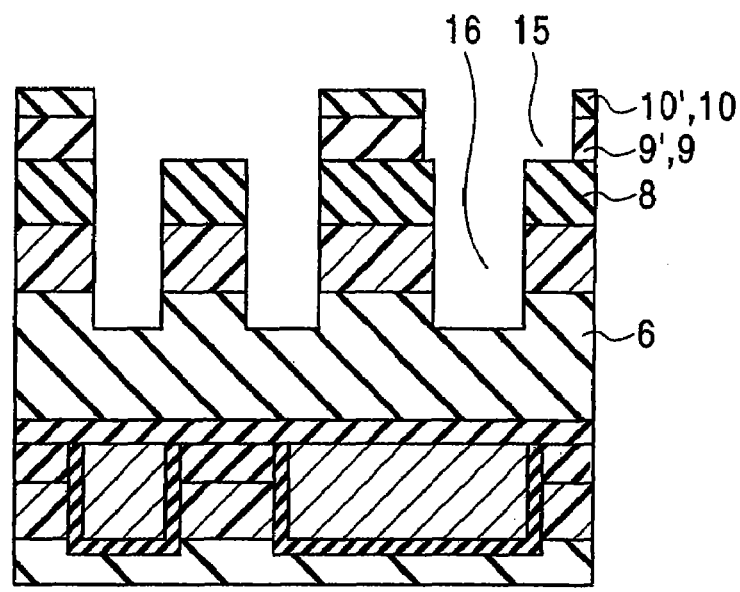
FIGS. 18E and 18F are sectional views showing respective steps after the step shown in FIG. 17D of the modification of the prior-application method for forming the wiring structure by the dual damascene process.
Figure 18F:
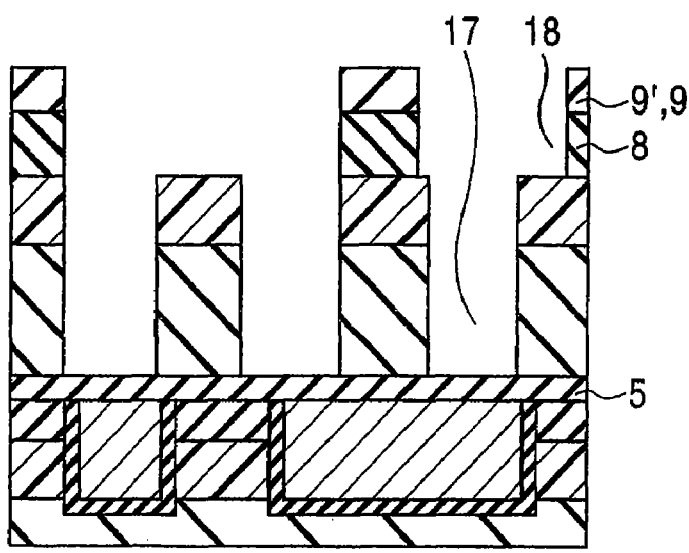
Figure 19G:
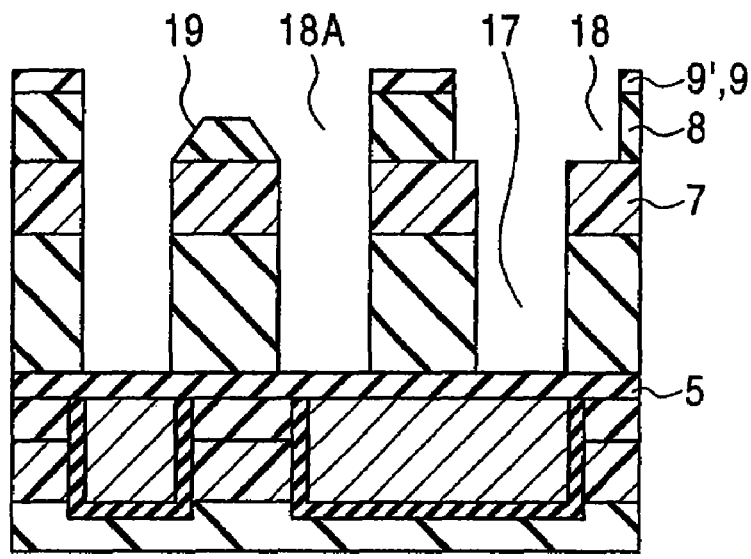
FIGS. 19G and 19H are sectional views showing respective steps after the step shown in FIG. 18F of the modification of the prior-application method for forming the wiring structure by the dual damascene process.
Figure 19H:
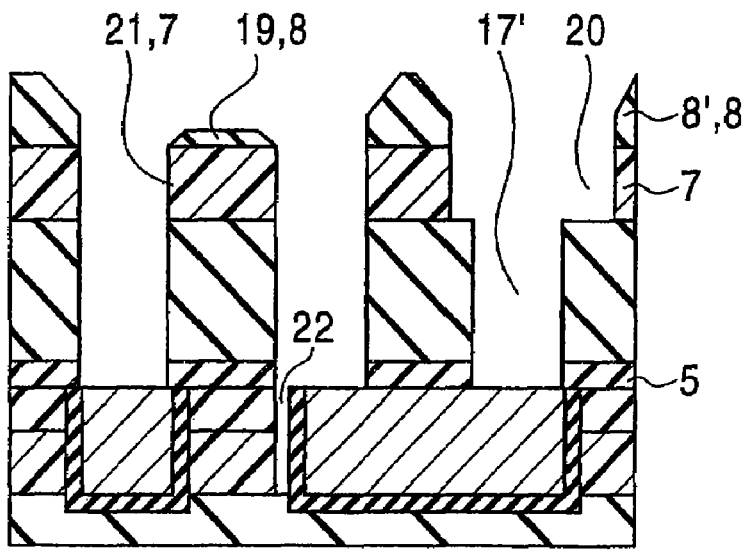
Figure 20I:
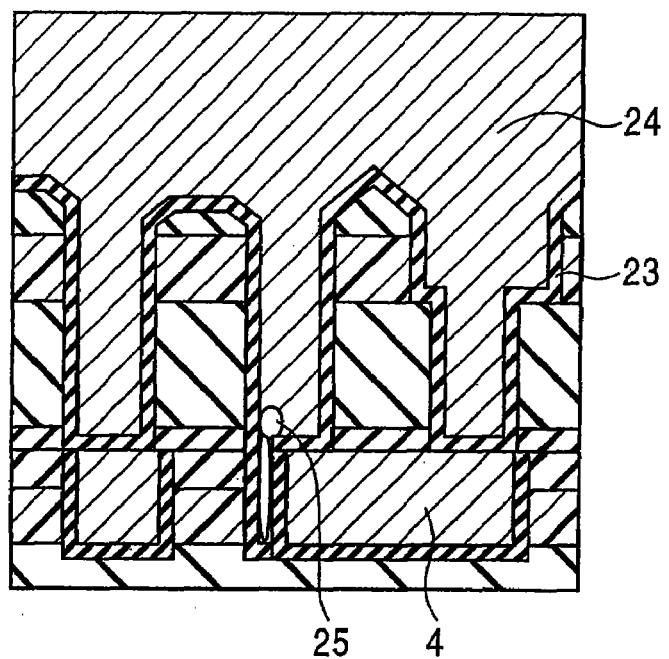
FIGS. 20I and 20J are sectional views showing respective steps after the step shown in FIG. 19H of the modification of the prior-application method for forming the wiring structure by the dual damascene process.
Figure 20J:
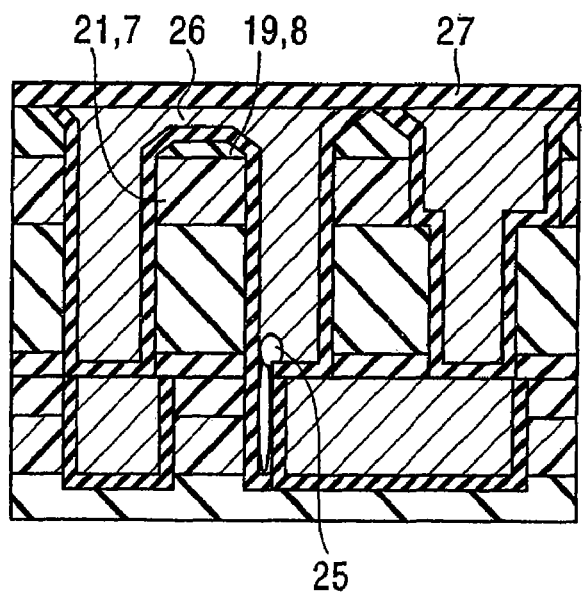
Figure 21:
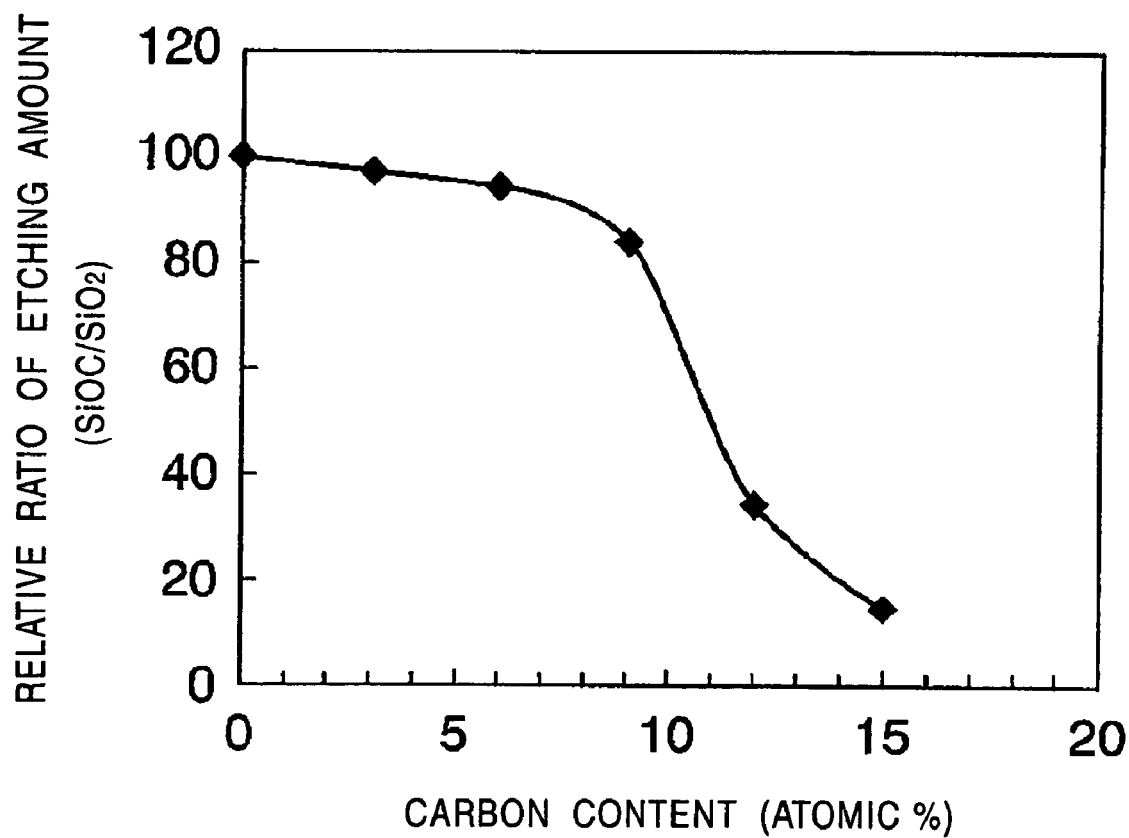
FIG. 21 is a graph showing the relationship between the carbon content of a SiOC film and the relative ratio (SiC film/SiO$_2$ film) of etching amounts.
Figure 22:
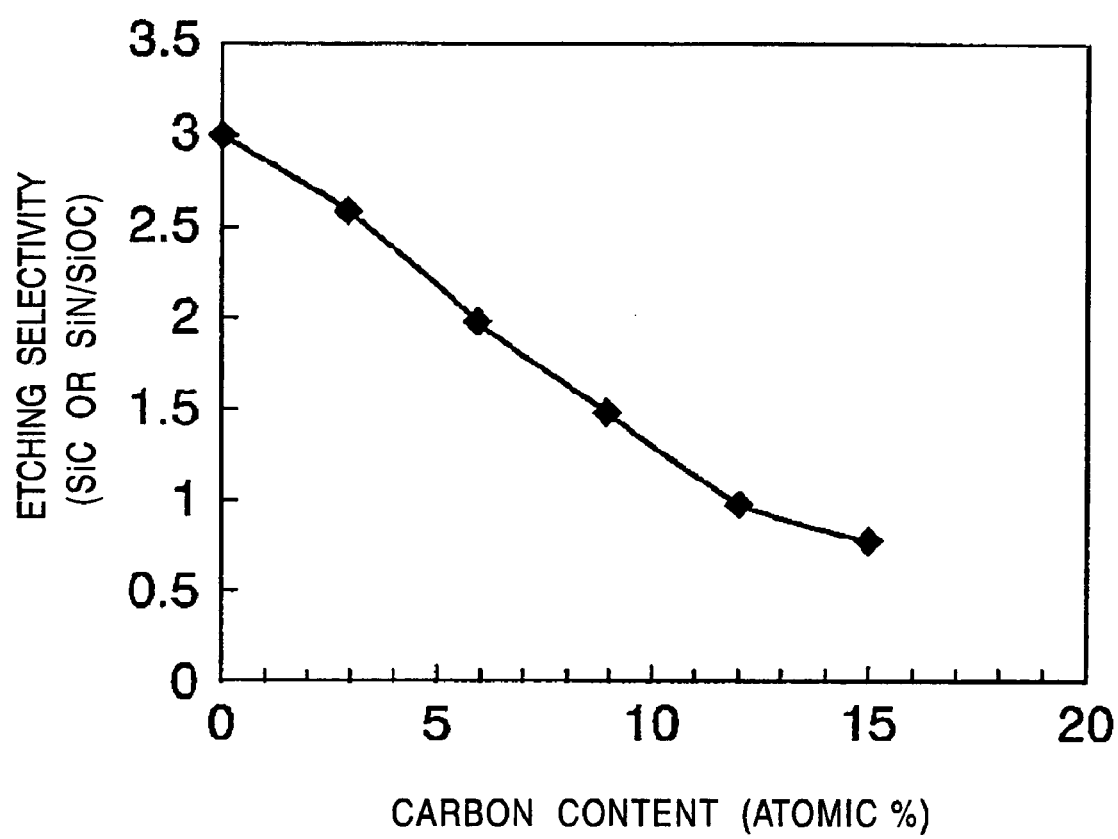
FIG. 22 is a graph showing the relationship between the carbon content of a SiOC film and etching selectivity (SiC film/SiOC film or SiN film/SiOC film)
Figure 23:
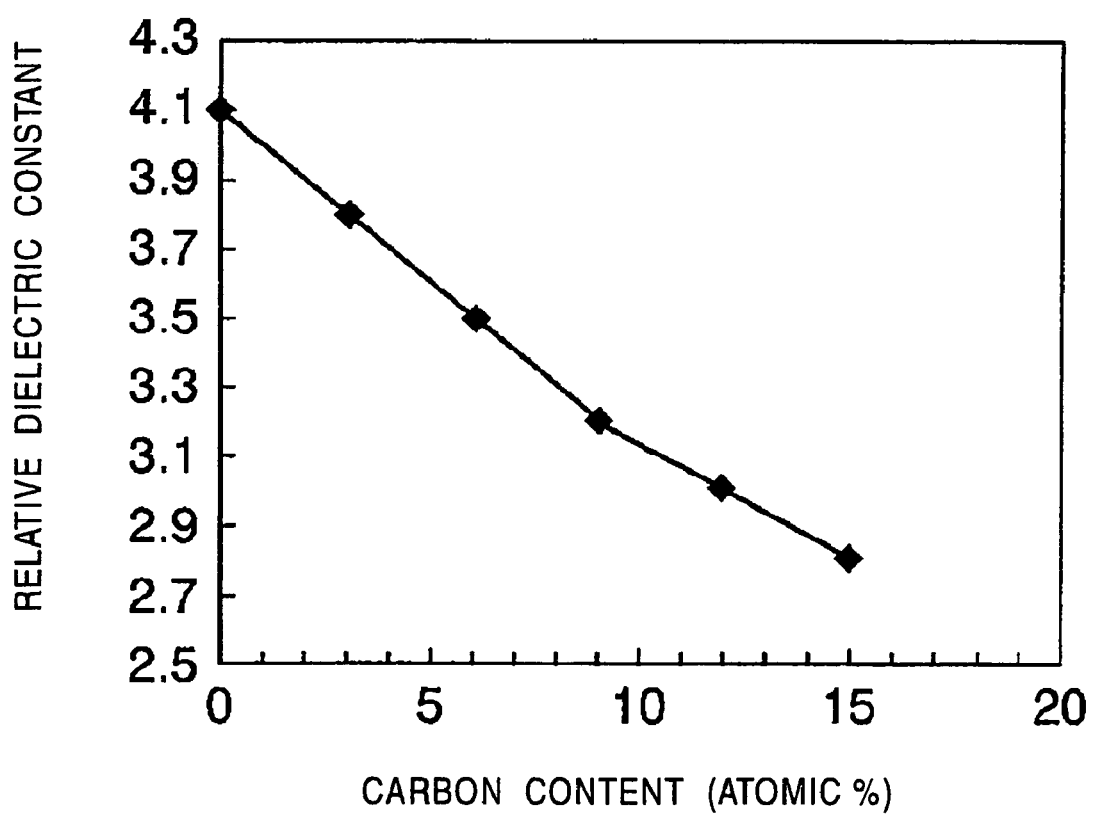
FIG. 23 is a graph showing the relationship between the carbon content and relative dielectric constant of a SiOC film.

Then, the etching extraneous matters remaining on the side walls of the wiring grooves 20 and the connecting holes 17 are removed by a post-treatment with an appropriate chemical and RF sputtering to convert the Cu affected layers at the bottoms of the connecting holes 17' to normal Cu layers. Then, as shown in FIG. 10H, for example, a Ta film 23 is deposited as a barrier metal by sputtering, and a Cu film 24 is deposited by an electrolytic plating or sputtering method to bury an electrically conductive film into the wiring grooves 20 and the connecting holes 17' at a time.

Furthermore, portions of the deposited Ta film 23 and Cu film 24, which are unnecessary as the wiring pattern, are removed by a chemical mechanical polishing (CMP) method to form the dual damascene multi-layer wiring structure shown in FIG. 6.

In this embodiment, the final thickness of the upper wiring is controlled to, for example, about 250 nm. Therefore, the thickness of the remaining SiOC film 28 functioning as the protective film for the PAE film 7 is about 30 nm. Like in the lower wiring pattern, for example, a SiC film 27 is deposited as an antioxidative layer on the dual damascene wiring 18.

In this embodiment, the laminated insulating film including the PAE film 2 or 7, the SiOC film 8 having a relative dielectric constant of 3.5, and the SiOC film 28 having a relative dielectric constant of 3.0 is used as the inter-wiring insulating film of each of the lower Cu buried wiring layer 23/4 and the upper Cu buried wiring layer 23/24, instead of a conventional laminated insulating film including the PAE film 2 or 7 and a $SiO_2$ film (relative dielectric constant 4.1). Therefore, the relative dielectric constant of the laminated insulating film can be decreased to decrease the inter-wiring capacity of each of the lower wiring and the upper wiring by about 8 to 13%, as compared with a wiring structure formed by a conventional dual damascene process. The inter-wiring capacity can be further decreased in comparison to the semiconductor device of the first embodiment.

In this embodiment, the carbon content of the SiOC film 28 is controlled to 6 atomic %, and thus the rate of etching for forming the apertures 18 shown in FIG. 9F can be increased for preventing the SiOC film 28 from remaining in a wide wiring groove. Also, since the carbon content of the SiOC film 28 is controlled to 6 atomic %, the etching selectivity of SiC film/SiOC film or SiN film/SiOC film can be maintained at 1.5 or more. Therefore, when the connecting holes 17' shown in FIG. 10G are formed, it is possible to prevent the occurrence of a slit-shaped trench in the inter-wiring insulating film of the lower wiring 4 or scraping of the aperture shoulders of the wiring grooves 20 of the upper wiring, unlike in the above-described modification. Thus, the wiring structure having the predetermined shape can easily be formed by the dual damascene process.

In the dual damascene multi-layer wiring structure formed through the above-described steps, when the resist mask 12 having the connecting hole pattern is formed, the step difference of the underlying layer can be suppressed to about 50 nm equal to the thickness of the remaining $SiO_2$ film 10, and thus the resist mask having the high-precision connecting hole pattern can be formed. By using the resist mask having the high-precision connecting hole pattern, the connecting holes with micro dimensions can be stably formed without deteriorating the shape of the wiring grooves.

As a result, good via contact characteristics can be obtained. By using the method of this embodiment, a semiconductor device comprising a low dielectric constant interlayer insulating film having a dual damascene structure with a good wiring shape can be manufactured in high yield.

In this embodiment, the types, thicknesses and production methods of the insulating films are not limited. For example, in this embodiment, the laminated film including the lower SiOC film 8 having a thickness of 20 nm and a carbon content of 12 atomic % and the upper SiOC film 28 having a thickness of 130 nm and a carbon content of 6 atomic % is deposited as the protective layer and as the first mask forming layer functioning as the third insulating film on the PAE film 7, and then the laminated film is polished by a CuCMP process so that the thickness of the remaining SiOC film 28 is 30 nm. However, the thickness may be larger or smaller than this as long as processing characteristics permit.

The carbon content of the SiOC film 28 is preferably 3 atomic % to 9 atomic % from the viewpoint of processing characteristics and the effect of decreasing the inter-wiring capacity, and the carbon content is not limited to 6 atomic %. Similarly, the carbon content of the SiOC film 8 is not limited to 12 atomic %, and the carbon content of the SiOC film 8 may be 12 atomic % or more for decreasing the relative dielectric constant of the inter-wiring insulating film.

Although, in this embodiment, the thickness of the remaining SiOC film 28 after CMP is set to 30 nm, the thickness is not limited to 30 nm as long as the exposure of the lower SiOC film 8 due to polishing variations and variations in the inter-wiring capacity permit. The method for depositing the SiOC film 28 is not limited to the parallel plate plasma CVD method, and a high-density plasma CVD method or a spin coating method may be used for deposition.

Additional description common to the methods for manufacturing the semiconductor devices of the first and second embodiments will be made below.

Although, in each of the first and second embodiments, the SiC film 5 or 27 is provided as the antioxidative layer for the Cu film, the antioxidative layer is not limited to the SiC film. A SiN film deposited by a CVD method, a SiC film containing a light element such as nitrogen ($N_2$), hydrogen (H), or the like, or a laminated film including these films may be used.

As the SiOC film 6 functioning as the interlayer insulating film of the connecting hole portion, for example, a SiOF film or $SiO_2$ film deposited by a CVD method, or a MSQ film or HSQ film deposited by a spin coating method may be used instead of the SiOC film.

As the PAE film 7 functioning as the inter-wiring insulating film of the upper wiring, a polyarylene ether film, an amorphous carbon film, or a polytetrafluoroethylene film can be used instead of the PAE film. Also, a xerogel film, a MSQ film having a porous structure, or the like may be used, or a combined film of these films may be used.

Although the $SiO_2$ film 10 of 50 nm in thickness and the SiN film 9 of 100 nm in thickness are deposited as the second and third mask forming layers, respectively, on the SiOC film 28, the types, thicknesses and production methods of the films are not limited to the above-described conditions, and any combination may be used as long as a lower mask layer can be etched by using an upper mask layer.

For example, a SiC film deposited by a CVD process may be used as the second mask forming layer instead of the SiN film, and the thickness may be decreased as long as the etching selectivity permits. Also, an amorphous silicon film formed by sputtering may be used as the third mask forming layer to permit further thinning of the film.

Furthermore, if an underlying layer for resist patterning of through holes has an allowable step difference to permit the connecting holes 17 to be formed in the SiOC film 6, only the SiN film 9 may be deposited and then subjected directly to a process for forming the wiring grooves using the resist mask.

In the first embodiment, a laminated insulating film including an organic insulating film and a SiOC film having a low relative dielectric constant is used as an inter-wiring insulating film of upper wiring instead of a conventional laminated insulating film including an organic insulating film and a $SiO_2$ film (relative dielectric constant 4.1). Therefore, the relative dielectric constant of the laminated insulating film can be decreased to realize a semiconductor device having a lower inter-wiring capacity than that of a conventional semiconductor device.

In the second embodiment, a laminated insulating film including an organic insulating film and a plurality of low dielectric constant SiOC films having different relative dielectric constants is used as an inter-wiring insulating film of upper wiring instead of a conventional laminated insulating film including an organic insulating film and a $SiO_2$ film (relative dielectric constant 4.1). Therefore, the relative dielectric constant of the laminated insulating film can be decreased to realize a semiconductor device having a lower inter-wiring capacity than that of a conventional semiconductor device.

In the method of the present invention, the carbon content of a SiOC film deposited as a first mask forming layer functioning as a third insulating film is controlled to a predetermined range for preventing the SiOC film from remaining in a wide wiring groove and for maintaining the etching selectivity of a second mask forming layer and a third mask forming layer to a SiOC film at a high value.

It is thus possible to prevent the occurrence of a slit-shaped trench in an inter-wiring insulating film of a lower wiring layer and scraping of the aperture shoulder of a wiring groove in an upper wiring layer, and thus a wiring structure having a predetermined shape can easily be formed by the dual damascene process.

In the method of the present invention, when a resist mask having a connecting hole pattern is formed on the second mask forming layer, a step difference can be suppressed to a value equal to the thickness of the third mask forming layer, and thus the resist mask having the high-precision connecting hole pattern can be formed. By using the resist mask having the high-precision connecting hole pattern, a connecting hole aperture with micro dimensions can be stably formed without deteriorating the shape of a wiring groove, thereby achieving excellent via contact characteristics.

Therefore, by using the method of the present invention, a semiconductor device comprising a low dielectric constant interlayer insulating film having a dual damascene wiring structure with a good wiring shape can be manufactured in high yield.

What is claimed is:

1. A semiconductor device having a wiring structure formed by a dual damascene method, the wiring structure comprising:
   a lower buried-wiring layer;
   an interlayer insulating film provided on the lower buried-wiring layer;
   an inter-wiring insulating film provided on the interlayer insulating film; and
   an upper buried-wiring layer buried in wiring grooves provided in the inter-wiring insulating film, the upper buried-wiring layer being electrically connected to the lower buried-wiring layer through contact plugs passing through the interlayer insulating film;
   wherein the interlayer insulating film is a first carbon-containing silicon oxide film (SiOC film), and
   the inter-wiring insulating film comprises a laminated insulating film including an organic low dielectric constant insulating film, and a second carbon-containing silicon oxide film (SiOC film) provided on the low dielectric constant insulating film, the second carbon-containing silicon oxide film having a lower carbon content than that of the first carbon-containing silicon oxide film.

2. The semiconductor device according to claim 1, wherein the carbon content of the second carbon-containing silicon oxide film is 3 atomic % to 9 atomic %.

3. The semiconductor device according to claim 1, wherein the lower buried-wiring layer is buried in the inter-wiring insulating film provided below the interlayer insulating film and comprising an organic insulating film and a carbon-containing silicon oxide film provided on the organic insulating film.

* * * * *